US012757454B2

(12) United States Patent
Thomas et al.

(10) Patent No.: US 12,757,454 B2
(45) Date of Patent: Oct. 6, 2026

(54) STEPWISE INTERNAL SPACERS FOR STACKED TRANSISTOR STRUCTURES

(71) Applicant: Intel Corporation, Santa Clara, CA (US)

(72) Inventors: Nicole K. Thomas, Portland, OR (US); Marko Radosavljevic, Portland, OR (US); Cheng-Ying Huang, Hillsboro, OR (US); Willy Rachmady, Beaverton, OR (US); Gilbert Dewey, Beaverton, OR (US); Ashish Agrawal, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 517 days.

(21) Appl. No.: 17/517,065

(22) Filed: Nov. 2, 2021

(65) Prior Publication Data

US 2023/0132749 A1 May 4, 2023

(51) Int. Cl.
*H10D 62/10* (2025.01)
*H10D 30/67* (2025.01)
*H10D 84/85* (2025.01)

(52) U.S. Cl.
CPC ....... *H10D 62/118* (2025.01); *H10D 30/6735* (2025.01); *H10D 30/6757* (2025.01); *H10D 84/85* (2025.01)

(58) Field of Classification Search
CPC ............. H10D 62/118; H10D 30/6735; H10D 30/6757; H10D 84/85; H10D 62/121; H10D 84/0184; H10D 84/0147; H10D 84/83; H10D 84/038; H10D 88/00; H10D 88/01
See application file for complete search history.

(56) References Cited

U.S. PATENT DOCUMENTS

| | | | | |
|---|---|---|---|---|
| 8,993,404 | B2 * | 3/2015 | Kobrinsky | H10D 1/692 438/396 |
| 10,192,867 | B1 * | 1/2019 | Frougier | H10D 30/014 |
| 10,256,158 | B1 * | 4/2019 | Frougier | H10D 84/017 |
| 2020/0105751 | A1 * | 4/2020 | Dewey | H10D 62/235 |
| 2020/0168703 | A1 * | 5/2020 | Rachmady | B82Y 10/00 |
| 2021/0074830 | A1 * | 3/2021 | Hiblot | H10D 30/6728 |

* cited by examiner

*Primary Examiner* — William B Partridge
*Assistant Examiner* — Erik A. Anderson
(74) *Attorney, Agent, or Firm* — Arcane Law PLLC

(57) ABSTRACT

Techniques are provided herein to form semiconductor devices having a stacked transistor configuration. In an example, an upper (e.g., n-channel) device and a lower (e.g., p-channel) device may both be gate-all-around (GAA) transistors each having any number of nanoribbons extending in the same direction where the upper device is located vertically above the lower device. According to some embodiments, an internal spacer structure extends between the nanoribbons of the upper device and the nanoribbons of the lower device along the vertical direction, where the spacer structure has a stepwise or an otherwise outwardly protruding profile as it extends between the nanoribbons of the upper device and the lower device. Accordingly, in one example, a gate structure formed around the nanoribbons of both the n-channel device and the p-channel device exhibits a greater width in the region between the nanoribbons of the n-channel device and the nanoribbons of the p-channel device.

22 Claims, 18 Drawing Sheets

STEPWISE INTERNAL SPACERS FOR STACKED TRANSISTOR STRUCTURES

FIELD OF THE DISCLOSURE

The present disclosure relates to integrated circuits, and more particularly, to an internal spacer fabrication process for stacked transistor devices.

BACKGROUND

As integrated circuits continue to scale downward in size, a number of challenges arise. For instance, reducing the size of memory and logic cells or increasing transistor density in a given die area is becoming increasingly more difficult. One possible solution is to stack transistor devices in a vertical direction to maximize the usage of the die footprint. Some transistor devices utilize nanoribbons with internal spacer structures to reduce parasitic capacitance and prevent electrical shorting between the gate and source or drain regions. There are many non-trivial challenges involved with the fabrication of such internal spacer structures.

Figure 1A:
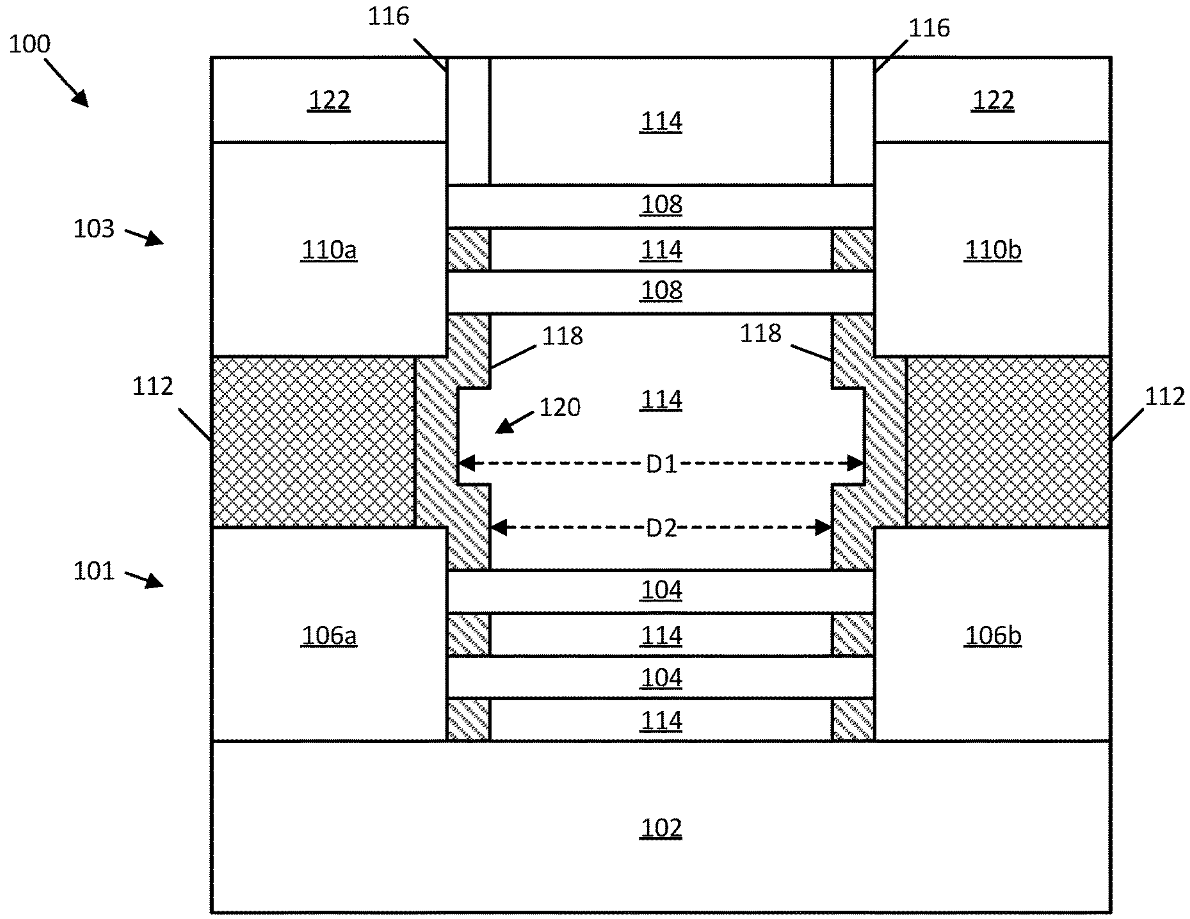
FIGS. 1A-1B are cross-sectional views of an example integrated circuit having a particular spacer structure geometry, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines and right angles (e.g., recesses and fins may be tapered and have rounded corners), and some features may have surface topology or otherwise be non-smooth, given real world limitations of the processing equipment and techniques used.

DETAILED DESCRIPTION

Techniques are provided herein to form integrated circuits having a stacked transistor configuration (e.g., stacked in a vertical z-direction). The techniques can be used in any number of transistor technologies and are particularly useful with respect to logic and memory cells or densely populated transistor regions that use gate-all-around (GAA) transistors. In one example, two different semiconductor devices of a given logic or memory cell, such as a synchronous random access memory (SRAM) cell, include a p-channel device and an n-channel device. The n-channel device and the p-channel device may both be GAA transistors each having any number of nanoribbons extending in the same direction where the n-channel device is located vertically above the p-channel device (or vice versa). In other examples the upper and lower devices are the same polarity. According to some embodiments, an internal spacer structure extends between the nanoribbons of the upper device and the nanoribbons of the lower device along the vertical direction, where the spacer structure has a stepwise or outwardly curved or otherwise protruding profile as it extends between the nanoribbons of the upper device and the lower device. This spacer profile results from a fabrication process that involves separately etching around the nanoribbons of the upper device and around the nanoribbons of the lower device, according to an embodiment. Additionally, in some cases, a common gate structure that includes one or more gate dielectric layers and one or more gate electrode layers may be formed around the nanoribbons of both the upper device and the lower device and will exhibit a greater lateral width in the region between the nanoribbons of the upper device and the nanoribbons of the lower device. In another example, a split-gate structure is used, where upper and lower gate structures are separated by an isolation structure. In some such cases, the isolation structure is at least partially laterally adjacent to the outwardly protruding spacer structure and thus will exhibit a greater lateral width than at least portions of the upper and lower gate structures that are not laterally adjacent to the outwardly protruding spacer structure. Numerous variations and embodiments will be apparent in light of this disclosure.

General Overview

As previously noted above, there remain a number of non-trivial challenges involved with internal spacer structures, particularly in the context of stacked nanoribbon semiconductor devices. In more detail, one way to increase transistor density is to stack transistor devices over one another in the vertical direction. In the case of nanoribbon devices, such as GAA transistors or forksheet transistors, some additional vertical distance is provided between upper and lower devices to provide sufficient isolation. However, this additional distance causes there to be uneven spacing between the various nanoribbons and devices. The uneven spacing causes fabrication challenges (e.g., non-uniform etching) when forming internal spacer structures that can lead to shorting between the gate electrode and source or drain regions of a given semiconductor device.

Thus, and in accordance with an embodiment of the present disclosure, techniques are provided herein to form stacked transistors (such as a first device over a second device) in a stepwise or piecemeal fashion to provide a more uniform etching process when forming internal spacers along each of the stacked transistors. According to some embodiments, following the etch used to define the regions for the source and drain, a protective liner is formed over the ends of the nanoribbons of the first device (e.g., upper device) and a lateral spacer etch is performed around the exposed nanoribbons of the second device (e.g., lower device). Then, the nanoribbons of the second device are protected by a barrier material while a portion of the protective liner is removed and a lateral spacer etch is performed around the exposed nanoribbons of the first device. By selectively processing each of the stacked transistors in a stepwise manner (rather than at the same time) the etch rates can be kept more uniform. Although description herein focuses on the use of GAA transistor configurations, the techniques can be applied to other channel configurations as well, such as forksheet transistors and fin-based field effect transistors (finFETs).

According to an embodiment, an integrated circuit includes a first semiconductor body (e.g., nanoribbon) extending in a first direction between a first source region and a first drain region and a second semiconductor body (e.g., nanoribbon) extending in the first direction between a second source region and a second drain region. The first semiconductor body may be, for example, one nanoribbon of a plurality of semiconductor nanoribbons extending between the first source region and the first drain region, and the second semiconductor body may be one nanoribbon of a plurality of semiconductor nanoribbons extending between the second source region and the second drain region. The first semiconductor nanoribbon (or other body) is spaced vertically from the second semiconductor nanoribbon (or other body) in a second direction orthogonal to the first direction. The integrated circuit also includes a first spacer structure that extends along sides of the first and second source regions as well as between the first semiconductor nanoribbon and the second semiconductor nanoribbon, and a second spacer structure that extends along sides of the first and second drain regions as well as between the first semiconductor nanoribbon and the second semiconductor nanoribbon.

In some cases, the integrated circuit includes a gate structure around both the first semiconductor nanoribbon and the second semiconductor nanoribbon. The gate structure has a first lateral width at the first and second semiconductor nanoribbons, and has a second lateral width greater than the first lateral width between the first semiconductor nanoribbon and the second semiconductor nanoribbon. In other examples, the integrated circuit has a split-gate configuration, which includes a first gate structure around the first semiconductor nanoribbon and a second gate structure around the second semiconductor nanoribbon, and an isolation structure separating the first and second gate structures. In one such case, the first and second gate structures each has a first lateral width at the first and second semiconductor nanoribbons, and the isolation structure has a second lateral width greater than the first width. In any such cases, the second lateral width can be, for example, more than 1 nanometer (nm) longer than the first lateral width, such as 2 nm longer, or 3 nm longer, or 4 nm longer, 5 to 10 nm longer, or more. Note the gate structures may be gate-all-around structures or tri-gate structures or double-gate structures, depending on the channel configuration.

According to another embodiment, a method of forming an integrated circuit includes forming a first section of a multilayer fin, the first section including first material layers alternating with second material layers, the second material layers comprising a semiconductor material suitable for use as a nanoribbon channel; forming a second section of the multilayer fin over the first section, the second section having a third material layer that is compositionally the same as the first material layers, wherein the third material layer is thicker than the first material layers; forming a third section of the multilayer fin over the second section, the third section including fourth material layers alternating with fifth material layers, wherein the fourth material layers are compositionally the same as the first and third material layers, and the fifth material layers comprise a semiconductor material suitable for use as a nanoribbon channel; forming a first sacrificial material adjacent to the first section of the multilayer fin; forming a liner over a sidewall of at least the third section of the multilayer fin; removing the first sacrificial material and laterally etching portions of the first material layers; forming a second sacrificial material adjacent to the first section of the multilayer fin; removing a portion of the liner over the sidewall of the third section of the multilayer fin and laterally etching portions of the fourth material layers; removing the second sacrificial material; and forming an inner spacer structure around exposed ends of the second and fifth material layers.

The techniques are especially suited for use with gate-all-around transistors such as nanowire and nanoribbon transistors. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate electrode can be formed with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate internal spacer structures that bend or protrude outwards or have a stepped profile between stacked devices and/or between a device and the substrate. In some embodiments, such tools may further indicate a gate structure that increases in width between adjacent pairs of vertically stacked devices.

It should be readily understood that the meaning of “above” and “over” in the present disclosure should be interpreted in the broadest manner such that “above” and “over” not only mean “directly on” something but also include the meaning of over something with an intermediate feature or a layer therebetween. Further, spatially relative terms, such as “beneath,” “below,” “lower,” “above,” “upper,” and the like, may be used herein for ease of description to describe one element or feature’s relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term “layer” refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Architecture

FIG. 1A is a cross sectional view of a portion of an integrated circuit 100 that includes a first semiconductor device 101 and a second semiconductor device 103 stacked vertically over first semiconductor device 101, according to an embodiment of the present disclosure. The cross-section view is taken lengthwise (perpendicular to gate structure) across first semiconductor device 101 and second semiconductor device 103 in a first direction while the devices are vertically stacked over one another in a second direction orthogonal to the first direction. Each of semiconductor devices 101 and 103 may be gate-all-around (GAA) transistors, although other transistor topologies and types could also benefit from the techniques provided herein. The illustrated embodiments herein use the GAA structure. Semiconductor devices 101 and 103 represent a portion of integrated circuit 100 that may contain any number of similar semiconductor devices.

As can be seen, semiconductor devices 101 and 103 are formed over a substrate 102. Any number of semiconductor devices can be formed in a stacked configuration over substrate 102, but two are used here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

First semiconductor device 101 may include any number of semiconductor nanoribbons 104 extending between a source region 106*a* and a drain region 106*b*. Likewise, second semiconductor device 103 may include any number of semiconductor nanoribbons 108 extending between a source region 110*a* and a drain region 110*b*. Any source region may also act as a drain region and vice versa, depending on the application. In some embodiments, semiconductor devices 101 and 103 have an equal number of nanoribbons, while in other embodiments they have an unequal number of nanoribbons. In some embodiments, each of nanoribbons 104 and nanoribbons 108 are formed from a fin of alternating material layers (e.g., alternating layers of silicon and silicon germanium) where sacrificial material layers are removed between nanoribbons 104 and nanoribbons 108. Each of nanoribbons 104 and nanoribbons 108 may include the same semiconductor material as substrate 102, or not. In still other cases, substrate 102 is removed. In some such cases, there may be, for example one or more backside interconnect and/or contact layers. In an such cases, and according to some embodiments, a vertical distance between about 30 nm and about 80 nm separates the nanoribbons 104 of first semiconductor device 101 from the nanoribbons 108 of second semiconductor device 103. Other embodiments may have a smaller or larger such vertical distance.

According to some embodiments, an insulating layer 112 is provided between stacked source regions 106*a* and 110*a* and between stacked drain regions 106*b* and 110*b*. Insulating layer 112 may be any suitable dielectric material, such as silicon dioxide, aluminum oxide, silicon nitride, or silicon oxycarbonitride. In still other embodiments, layer 112 may be or otherwise include an air gap or void. According to some embodiments, each of source regions 106/110*a* and drain regions 106*b*/110*b* are epitaxial regions that are provided using an etch-and-replace process. In other embodiments one or both of the source regions 106*a*/110*a* and drain regions 106*b*/110*b* could be, for example, implantation-doped native portions of the semiconductor nanoribbons, fins or substrate. Any semiconductor materials suitable for source and drain regions can be used (e.g., group IV and group III-V semiconductor materials). The source regions 106*a*/110*a* and drain regions 106*b*/110*b* may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

Insulating layer 122 allows for a planarized structure, such that the top surface of gate structure 114 is co-planar with the top surface of insulating layers 112. Insulating layer 122 may be the same material as insulating layer 112, or any other suitable dielectric material. Gate structure 114 is provided over each of nanoribbons 104 and nanoribbons 108, according to some embodiments. Spacer structures 116 are included on either side of gate structure 114. Spacer structures 116 may include a dielectric material, such as silicon nitride, silicon oxynitride, or silicon oxycarbonitride. Gate structure 114 includes both a gate dielectric around each of nanoribbons 104 and nanoribbons 108 and a gate electrode over the gate dielectric. The gate dielectric may include a single material layer or multiple material layers. In some embodiments, the gate dielectric includes a first dielectric layer such as an oxide native to nanoribbons 104 and 108 (e.g., silicon oxide) and a second dielectric layer that includes a high-K material (e.g., such as hafnium oxide). The high-K material may be doped with an element to affect the threshold voltage of the given semiconductor device. In other embodiments, the gate dielectric only includes high-K dielectric material; in still other embodiments, the gate dielectric only includes regular-K dielectric material (e.g., silicon oxide). In some embodiments, the gate dielectric around nanoribbons 104 has a different element doping concentration compared to the gate dielectric around nanoribbons 108. According to some embodiments, the doping element used in the gate dielectric is lanthanum.

According to some embodiments, the gate electrode extends over the gate dielectric around each of nanoribbons 104 and nanoribbons 108 and also generally fills the remaining space between the various nanoribbons of any number of stacked semiconductor devices. The gate electrode may include any sufficiently conductive material such as a metal, metal alloy, or doped polysilicon. In some embodiments, the gate electrode includes one or more workfunction metals around nanoribbons 104 and 108. In some embodiments, semiconductor device 101 is a p-channel device that includes n-type dopants within nanoribbons 104 and includes a workfunction metal having titanium around nanoribbons 104 and semiconductor device 103 is an n-channel device that includes p-type dopants within nanoribbons 108 and includes a workfunction metal having tungsten around nanoribbons 108. The gate electrode may also include a fill metal or other conductive material around the workfunction metals to provide the whole gate electrode structure. According to some embodiments, the gate structure may be interrupted between any adjacent semiconductor devices in the horizontal direction by a gate cut structure.

As discussed above, semiconductor device 101 may be a p-channel device having semiconductor nanoribbons 104 doped with n-type dopants (e.g., phosphorous or arsenic) and semiconductor device 103 may be an n-channel device having semiconductor nanoribbons 108 doped with p-type dopants (e.g., boron). Each of semiconductor devices 101 and 103 are separated by a vertical distance that is larger than the distance between adjacent nanoribbons.

According to some embodiments, internal spacers 118 extend vertically between semiconductor devices 101 and 103 and also between adjacent nanoribbons of each of semiconductor devices 101 and 103. Internal spacers 118 may include any suitable dielectric material, such as silicon dioxide, aluminum oxide, silicon nitride, silicon carbide, or silicon oxycarbonitride or low-K versions (e.g., porous or doped) of any of these that can provide electrical isolation between gate structure 114 and the source or drain regions. In some embodiments, internal spacers 118 have the same material composition as spacer structures 116. As can be seen, each of the two internal spacers 118 has a mid-portion that is continuous in nature and includes a protruding portion or recess 120 located along the vertical length of internal spacers 118 between semiconductor devices 101 and 103. Such recesses 120 are left behind when forming internal spacers 118 as described in more detail herein with reference to the illustrated fabrication process of FIGS. 2A-2L'. Additionally, since the recesses 120 are occupied by gate structure 114, a width of gate structure 114 will be greater between semiconductor devices 101 and 103 (e.g., in the area of recess 120) than it is between the nanoribbons of each of semiconductor devices 101 and 103. In more detail, the left-side internal spacer structure 118 includes a first portion extending along the corresponding lower source region 106*a*, a second portion extending along the corresponding upper source region 110*a*, and a third portion connecting the respective first and second portions; likewise, the right-side internal spacer structure 118 includes a first portion extending along the corresponding lower drain region 106*b*, a second portion extending along the corresponding upper drain region 110*b*, and a third portion connecting the respective first and second portions. Note that each third portion defines the bottom of the respective recess 120, and that recess 120 may be curved or tapered or other recess-like shape and need not be shaped as depicted, given real-world process conditions. Further note that the maximum horizontal distance (D1) between the third portion of the left-side spacer structure 118 and the third portion of the right-side spacer structure 118 is longer than the maximum horizontal distance (D2) between the first portion of the left-side spacer structure 118 and the first portion of the right-side spacer structure 118.

Further note in this embodiment that gate structure 114 fills the recesses 120. In some embodiments, the gate dielectric of gate electrode 114 also conformally deposits along the inward facing sidewalls of the internal spacer structures 118, including the bottom of the recesses 120, and the gate electrode of gate structure 114 fills the remainder of the recesses 120, such that the gate dielectric is also between the internal spacer structure 118 and the gate electrode, in addition to being between gate structure 114 and semiconductor nanoribbons 104 and 108. In some embodiments, there may be one or more workfunction metals within the recesses 120. In one such case, the portion of gate structure 114 on the lower channel region including nanoribbons 104 has an n-type workfunction metal, and the portion of gate structure 114 on the upper channel region including nanoribbons 108 has a p-type workfunction metal, or vice-versa. In such cases, the recesses 120 may include both the n-type and p-type workfunction metals. In other such embodiments, only one of the lower gate electrode materials or the upper gate electrode materials fill the remainder of the recesses 120 (e.g., in cases where distinct upper and lower portions of gate structure 114 are implemented in an asymmetric fashion (one portion is taller within the gate trench than the other portion).

Figure 1B:
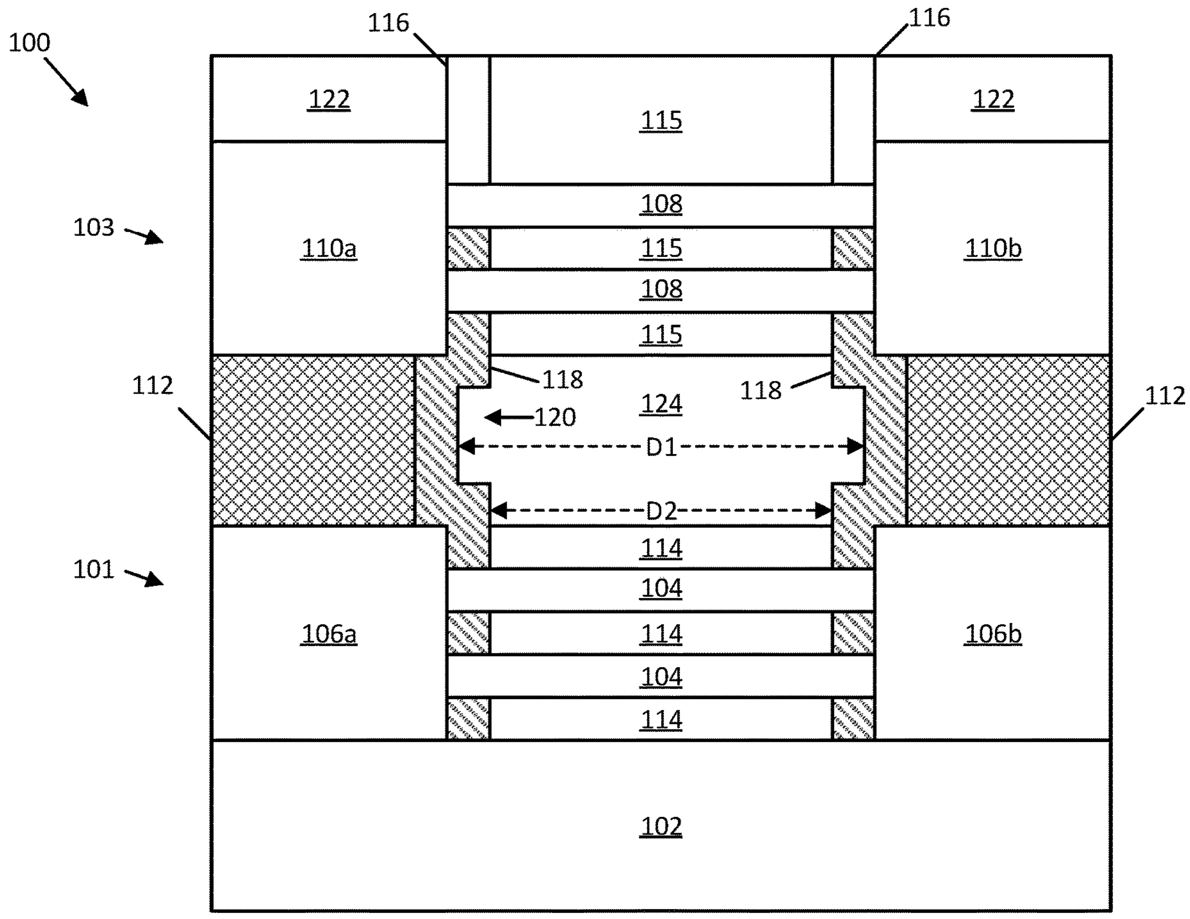

FIG. 1B is a cross sectional view of a portion of an integrated circuit 100 that includes a first semiconductor device 101 and a second semiconductor device 103 stacked vertically over first semiconductor device 101, according to another embodiment of the present disclosure. As can be seen, this example is similar to that of FIG. 1A, except that this example includes a split-gate configuration, rather than a single monolithic gate structure for both the upper and lower devices. In particular, lower gate structure 114 is around nanowires 104, and upper gate structure 115 is around nanowires 108. An isolation structure 124 is between and separates the lower gate structure 114 and the upper gate structure 115. The previous relevant discussion for each of the depicted features is equally applicable here. Note that the lower gate structure 114 may be configured differently from the upper gate structure 115, or the same. In one example case, the lower gate structure 114 and the upper gate structure 115 include the same gate dielectric but include different workfunction materials in their respective gate electrodes. For instance, one of the upper or lower gate electrode may include a p-type workfunction material (e.g., titanium nitride) and the other of the upper or lower gate electrode may include an n-type workfunction material (e.g., titanium aluminum carbide). The isolation structure 124 can be any suitable dielectric material, such as silicon oxide, and may be the same material, for instance, as insulating layers 112 and/or 122.

Further note in this embodiment that isolation structure 124 fills the recesses 120. In some such embodiments, the recesses 120 are void of any gate structure 114 materials (e.g., they are removed prior to deposition of isolation structure 124). In other embodiments, the gate dielectric of gate electrode 114 remains along the inward facing sidewalls of the internal spacer structures 118, including the bottom of the recesses 120, such that the gate dielectric of gate electrode 114 is also between the internal spacer structure 118 and isolation structure 124, in addition to being between gate structure 114 and semiconductor nanoribbons 104. In other embodiments, isolation structure 124 may be thinner, such that is does not completely fill the recesses 120. In such cases, recesses 120 may also include a portion of one or both gates structures 114 and 115, depending on the symmetry of the upper and lower gate structures relative to the recesses 120. The previous relevant discussion with respect to one or more workfunction metals being in the recesses 120 is equally applicable here.

Fabrication Methodology

FIGS. 2A-2L' include cross-sectional views that collectively illustrate an example process for forming an integrated circuit configured with stacked semiconductor devices having a stepped internal spacer structure, in accordance with some embodiments of the present disclosure. Each figure shows an example structure that results from the process flow up to that point in time, so the depicted structure evolves as the process flow continues, culminating in the structure shown in FIG. 2L (or 2L'), which is similar to the structure illustrated in FIG. 1. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
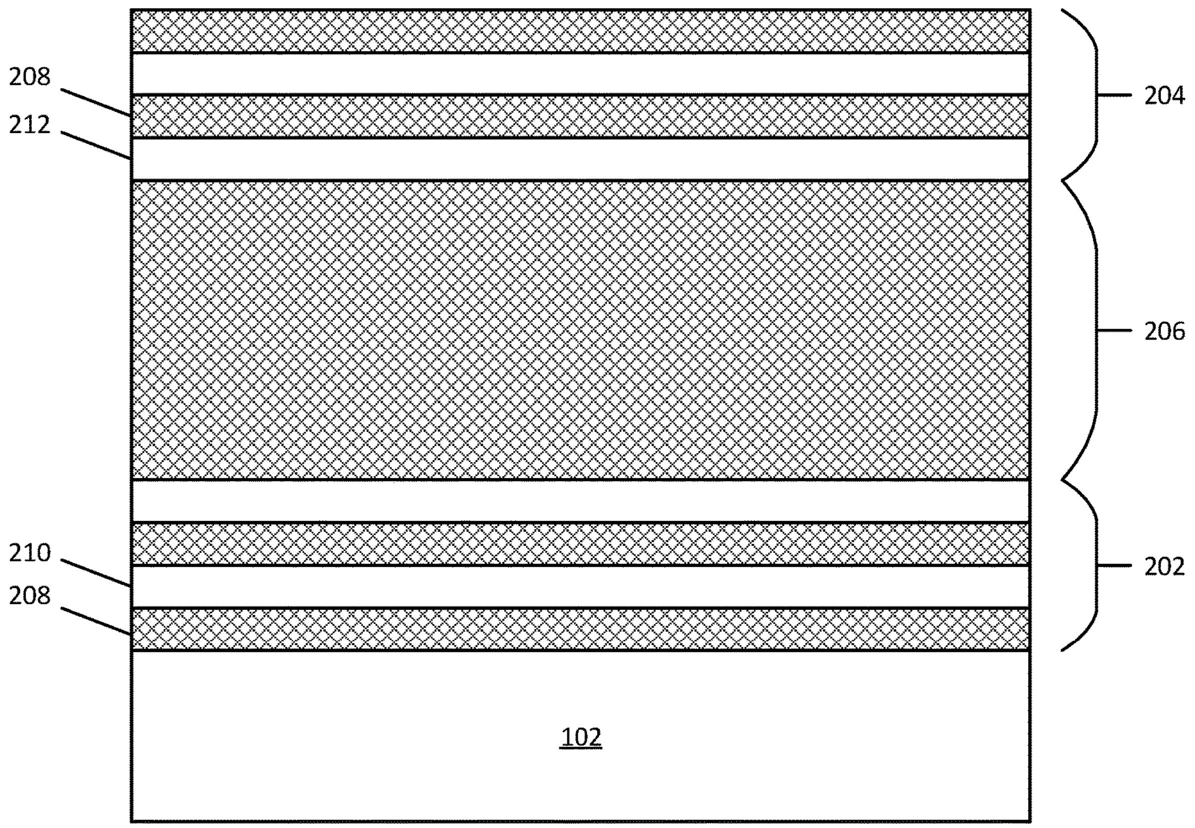
FIGS. 2A-2L' are cross-sectional views that collectively illustrate an example process for forming an integrated circuit using a lattice stack to affect formation of an internal spacer, in accordance with some embodiments of the present disclosure.

FIG. 2A illustrates a cross-sectional view across a substrate having a series of material layers deposited over it, according to an embodiment of the present disclosure. The previous relevant discussion with respect to example configurations and materials for substrate 102 is equally applicable here. Alternating material layers may be deposited over substrate 102, including a first layer stack 202, a second layer stack 204, and a spacer layer 206 between first layer stack 202 and second layer stack 204. Each of first and second layer stacks 202 and 204 includes sacrificial layers 208 alternating with other material layers, such as first semiconductor layers 210 of first layer stack 202 and second semiconductor layers 212 of second layer stack 204. Any number of alternating sacrificial layers 208 and material layers may be deposited within each of first layer stack 202 and second layer stack 204. It should be noted that the cross section illustrated in FIG. 2A is taken along the length of a fin formed from the multiple alternating layers and extending up above the surface of substrate 102.

According to some embodiments, sacrificial layers 208 have a different material composition than each of first semiconductor layers 210 and second semiconductor layers 212. In some embodiments, sacrificial layers 208 are silicon germanium (SiGe) while each of first semiconductor layers 210 and second semiconductor layers 212 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 208 and first and second semiconductor layers 210 and 212, the germanium concentration is different between sacrificial layers 208 and first and second semiconductor layers 210 and 212. For example, sacrificial layers 208 may include a higher germanium content compared to first and second semiconductor layers 210 and 212. Spacer layer 206 may include the same material as sacrificial layers 208. In some examples, spacer layer 206 can be any material that exhibits a high etch selectivity with the material of semiconductor layers 210 and 212.

While dimensions can vary from one example embodiment to the next, the thickness of each sacrificial layer 208 may be between about 5 nm and about 20 nm. In some embodiments, the thickness of each sacrificial layer 208 is substantially the same (e.g., within 1-2 nm) across each of first layer stack 202 and second layer stack 204. The thickness of each of first semiconductor layers 210 and second semiconductor layers 212 may be about the same as the thickness of each sacrificial layer 208 (e.g., about 5-20 nm). However, according to some embodiments, the thickness of spacer layer 206 is thicker than any of sacrificial layers 208. Spacer layer 206 is provided to create a sufficient spacing between the adjacent semiconductor devices to be formed from first semiconductor layers 210 and second semiconductor layers 212. While dimensions can vary from one example embodiment to the next, the thickness of spacer layer 206 may be between about 30 nm to about 80 nm. Each of sacrificial layers 208, first semiconductor layers 210, spacer layer 206, and second semiconductor layers 212 may be deposited using any known material deposition technique, such as chemical vapor deposition (CVD), plasma-enhanced chemical vapor deposition (PECVD), physical vapor deposition (PVD), or atomic layer deposition (ALD).

First semiconductor layers 210 may be doped with either n-type dopants (to produce a p-channel transistor) or p-type dopants (to produce an n-channel transistor). Similarly, second semiconductor layers 212 may be doped with either n-type dopants (to produce a p-channel transistor) or p-type dopants (to produce an n-channel transistor).

Figure 2B:
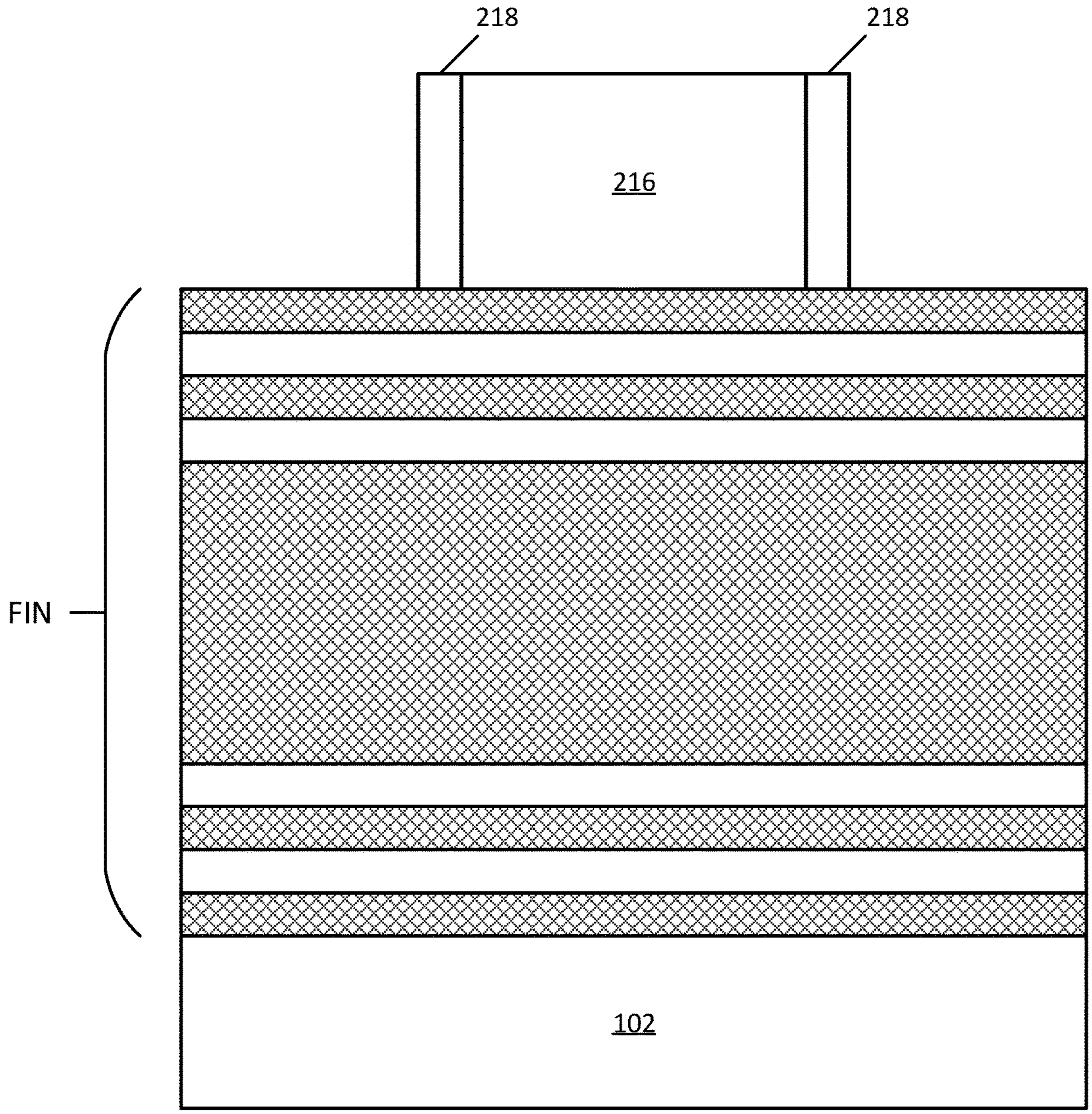

FIG. 2B illustrates a cross-sectional view of the structure shown in FIG. 2A following the formation of a sacrificial gate structure 216 and sidewall spacers 218 over the alternating layer structure of the fin, according to an embodiment. Sacrificial gate structure 216 may run in an orthogonal direction to the length of the fin and may include any material that can be safely removed later in the process without etching or otherwise damaging any portions of the fin or of spacer structures 218. In some embodiments, sacrificial gate structure 216 includes polysilicon. Spacer structures 218 may be formed using an etch-back process where spacer material is deposited everywhere and then anisotropically etched to leave the material only on sidewalls of structures including sacrificial gate structure 216. Spacer structures 218 may include a dielectric material, such as silicon nitride, silicon oxy-nitride, or any formulation of those layers incorporating carbon or boron dopants. Sacrificial gate structure 216 together with spacer structures 218 define a portion of the fin that will be used to form a stack of transistor devices as discussed further herein.

Figure 2C:
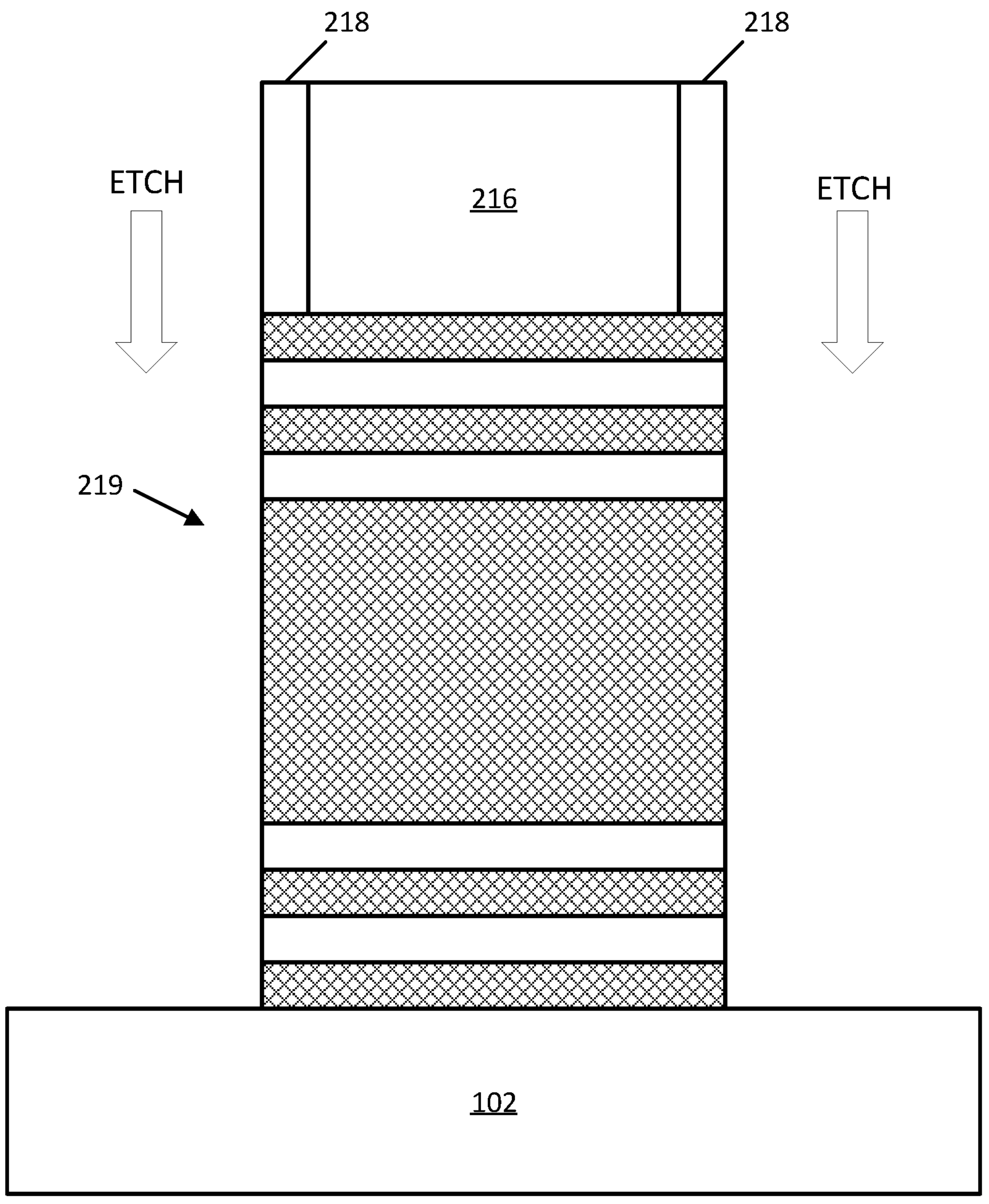

FIG. 2C illustrates a cross-sectional view of the structure shown in FIG. 2B following the removal of the exposed fin not under sacrificial gate structure 216 and sidewall spacers 218, according to an embodiment of the present disclosure. According to some embodiments, the various layers of the different layer stacks are etched at substantially the same rate using an anisotropic RIE process. In some embodiments, some undercutting occurs along the edges of the resulting fin 219 beneath spacer structures 218 such that the length of fin 219 is not exactly the same as a sum of the widths of spacer structures 218 and a width of sacrificial gate structure 216.

The RIE process may also etch into substrate 102 thus recessing portions of substrate 102 on either side of fin 219.

Figure 2D:
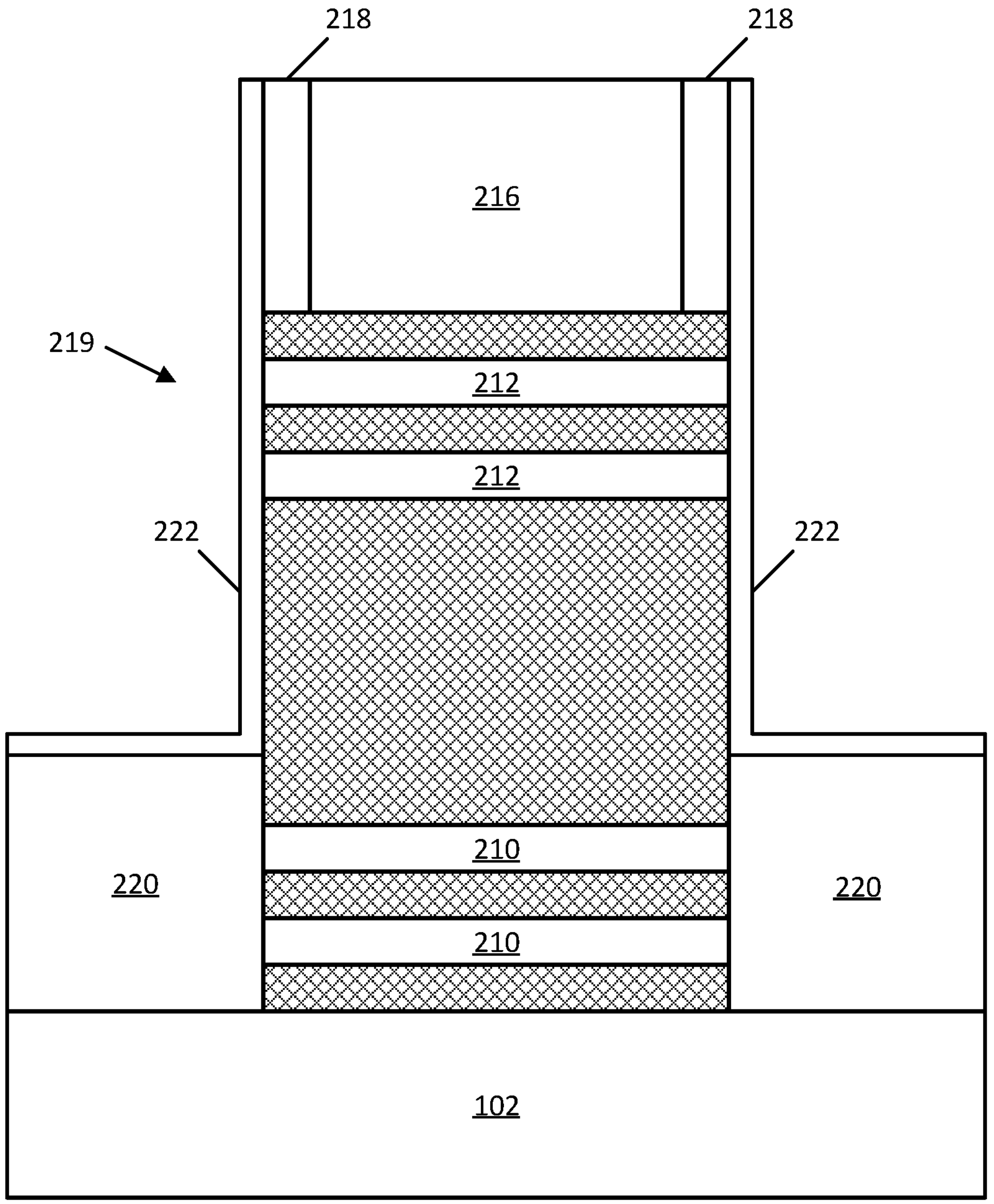

FIG. 2D illustrates a cross-sectional view of the structure shown in FIG. 2C following the formation of a first sacrificial material 220 and a liner 222, according to an embodiment of the present disclosure. First sacrificial material 220 may be deposited within the trenches formed on either side of fin 219 and then recessed back using an isotropic etching process to a height that is at least above each of first semiconductor layers 210 but below each of second semiconductor layers 212. For example, first sacrificial material 220 may have a top surface that is about 5-10 nm above the top-most first semiconductor layer 210. First sacrificial material 220 may be any carbon-based material that can be removed using an ashing process. In some examples, first sacrificial material 220 includes a carbon hard mask (CHM) material. In some examples, first sacrificial material 220 includes silicon and carbon along with any amount of oxygen and/or nitrogen.

Following the formation of first sacrificial material 220, a liner 222 may be formed over the remaining sidewalls of fin 219 and over the top surface of first sacrificial material 220. Liner 222 may include any nitride material deposited using atomic layer deposition (ALD), according to some examples. In some such examples, liner 222 includes titanium nitride (TiN), silicon carbonitride, silicon oxynitride, or silicon oxycarbonitride. Liner 222 may be deposited to an average thickness between about 1 nm and about 5 nm), according to some examples.

Figure 2E:
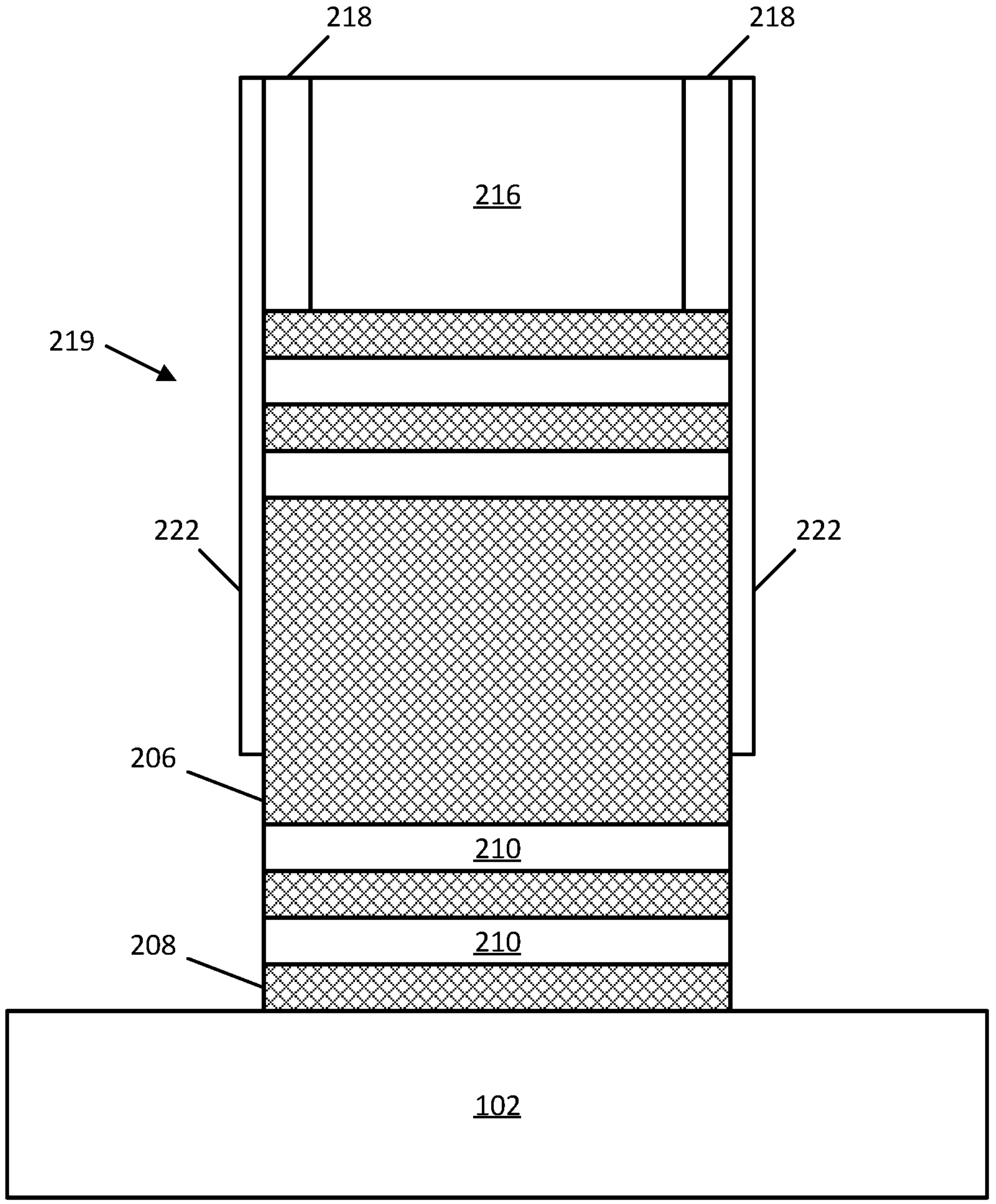

FIG. 2E illustrates a cross-sectional view of the structure shown in FIG. 2D following the removal of first sacrificial material 220, according to an embodiment of the present disclosure. An anisotropic etching process may first be performed to remove the portion of liner 222 over the top surface of first sacrificial material 220. The directional nature of the anisotropic etch will remove the horizontal portion of liner 222 while substantially maintaining the vertical portion of liner 222 along the sidewalls of fin 219. Following the removal of the portion of liner 222, an isotropic etching process (e.g., ashing) may be used to remove first sacrificial material 220, thus exposing the ends of first semiconductor layers 210 and the adjacent sacrificial layers 208. According to some embodiments, a portion of spacer layer 206 beneath liner 222 is also exposed. In some examples, the exposed portion of spacer layer 206 has a height that is substantially similar (e.g., within 2 nm) to a thickness of sacrificial layers 208.

Figure 2F:
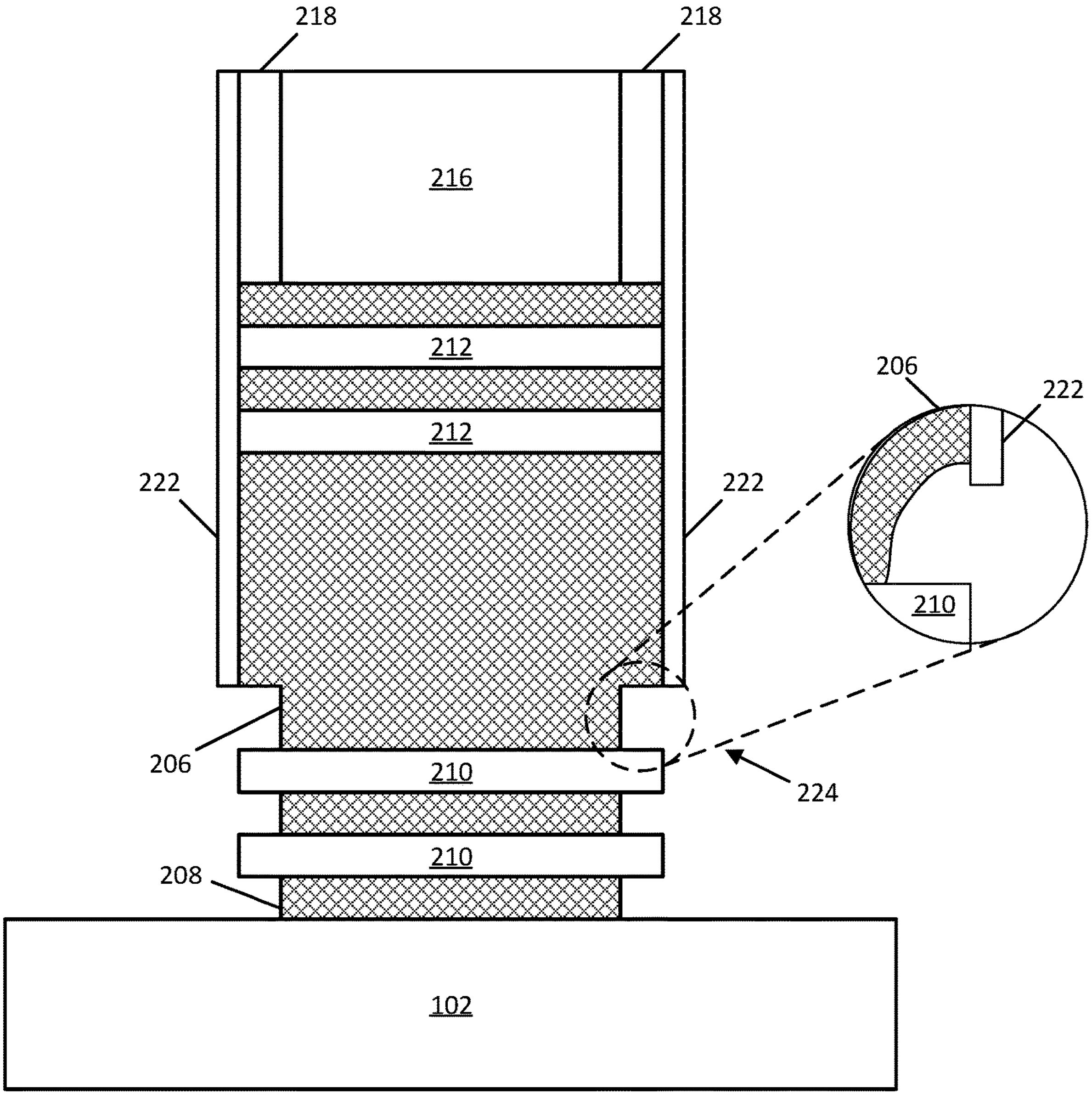

FIG. 2F illustrates a cross-sectional view of the structure shown in FIG. 2E following the removal of portions of sacrificial layers 208 and spacer layer 206, according to an embodiment of the present disclosure. An isotropic etching process may be used to recess the exposed ends of each sacrificial layer 208 adjacent to first semiconductor layers 210. Due to the presence of liner 222, the sacrificial layers 208 around second semiconductor layers 212 and a majority of spacer layer 206 is protected from the etching process, which yields a more uniform etching profile across each sacrificial layer 208 adjacent to first semiconductor layers 210. According to some embodiments, the etching process also etches portions of spacer layer 206 thus forming notches 224 along the lower corners of spacer layer 206. As seen in the magnified view at one of the corners of spacer layer 206, the notch may have a concave shape due to the isotropic nature of the etching process.

Figure 2G:
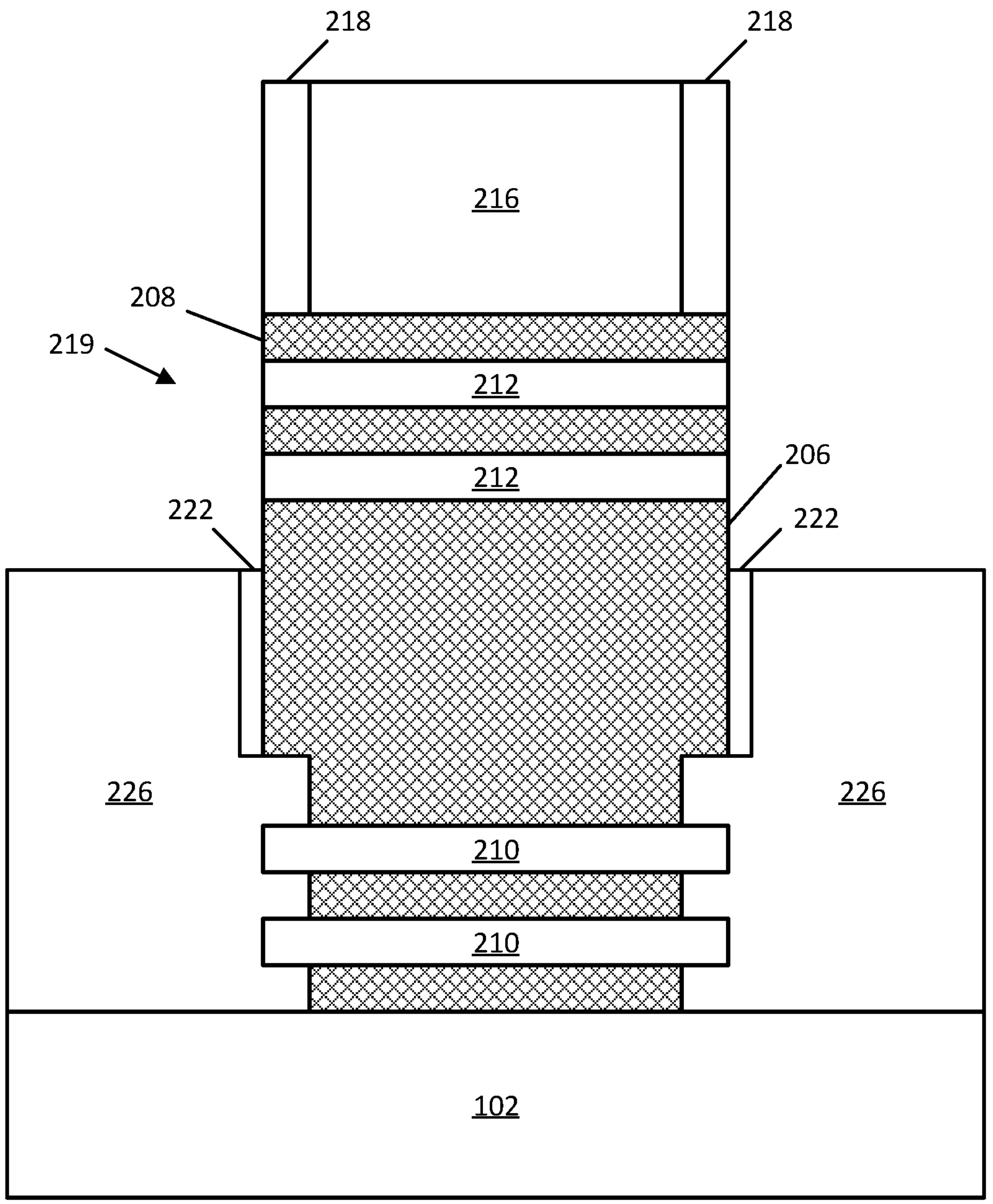

FIG. 2G illustrates a cross-sectional view of the structure shown in FIG. 2F following the formation of a second sacrificial material 226 and removal of another portion of liner 222, according to an embodiment of the present disclosure. Second sacrificial material 226 may be deposited within the trenches formed on either side of fin 219 and then recessed back using an isotropic etching process to a height that is at least below each of second semiconductor layers 212 but above each of first semiconductor layers 210. For example, second sacrificial material 226 may have a top surface that is about 5-10 nm below the bottom-most second semiconductor layer 212. Second sacrificial material 226 may be any carbon-based material that can be removed using an ashing process. In some examples, second sacrificial material 226 includes a carbon hard mask (CHM) material. In some examples, second sacrificial material 226 includes silicon and carbon along with any amount of oxygen and/or nitrogen.

Following the formation of second sacrificial material 226, the exposed portion of liner 222 along the sidewalls of fin 219 may be removed using an isotropic etching process. Note that a portion of liner 222 may remain along the sidewall of fin 219 as it is protected by second sacrificial material 226. The removal of the sidewall portion of liner 222 exposes the ends of second semiconductor layers 212 and the adjacent sacrificial layers 208. According to some embodiments, a portion of spacer layer 206 above the top surface second sacrificial material 226 is also exposed. In some examples, the exposed portion of spacer layer 206 has a height that is substantially similar (e.g., within 2 nm) to a thickness of sacrificial layers 208.

Figure 2H:
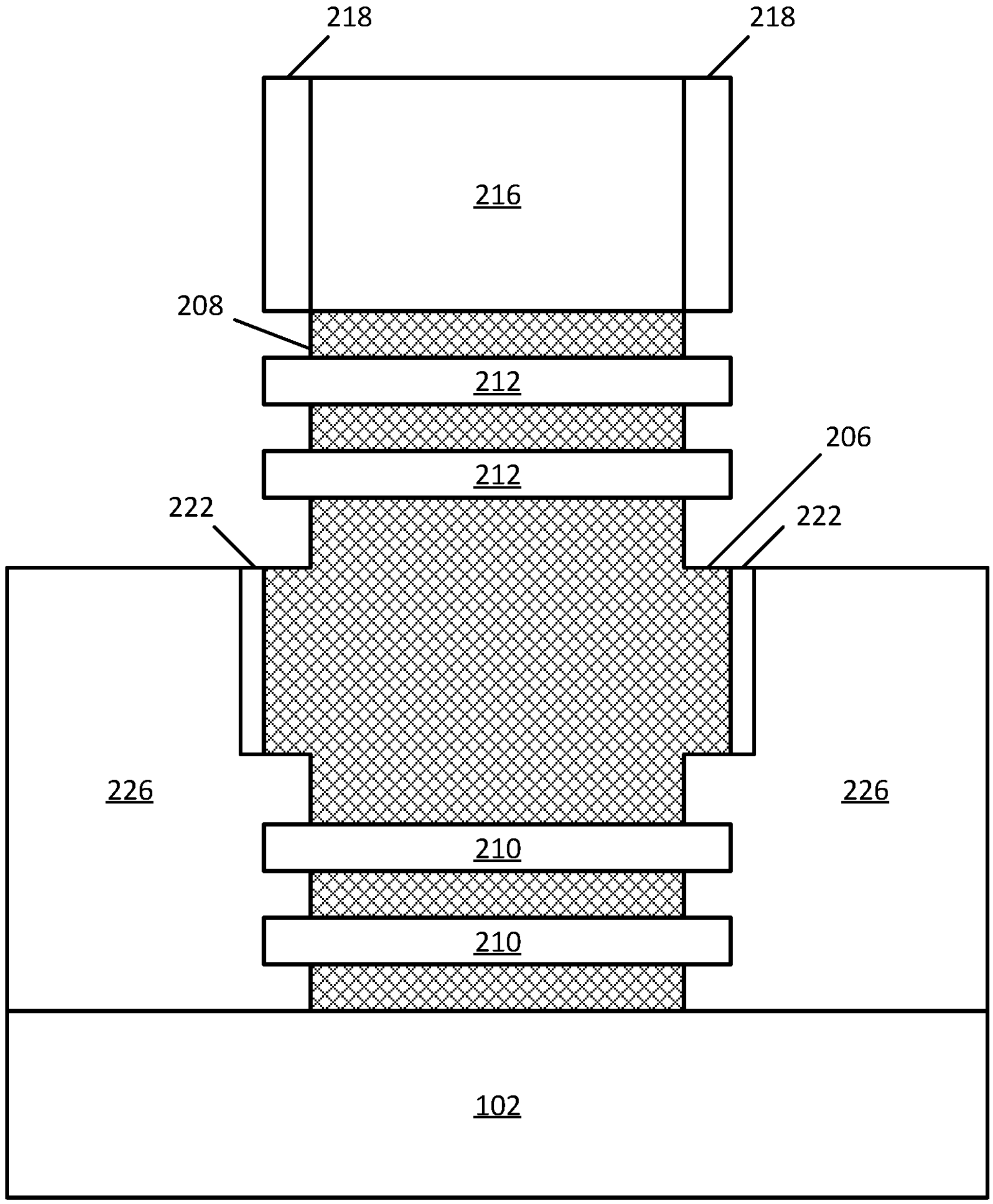

FIG. 2H illustrates a cross-sectional view of the structure shown in FIG. 2G following the removal of portions of sacrificial layers 208 and spacer layer 206, according to an embodiment of the present disclosure. An isotropic etching process may be used to recess the exposed ends of each sacrificial layer 208 adjacent to second semiconductor layers 212. Due to the presence of second sacrificial material 226, the sacrificial layers 208 around first semiconductor layers 210 and a majority of spacer layer 206 is protected from the etching process, which yields a more uniform etching profile across each sacrificial layer 208 adjacent to second semiconductor layers 212. According to some embodiments, the etching process also etches portions of spacer layer 206 thus forming notches similar to notches 224 along the upper corners of spacer layer 206.

Figure 2I:
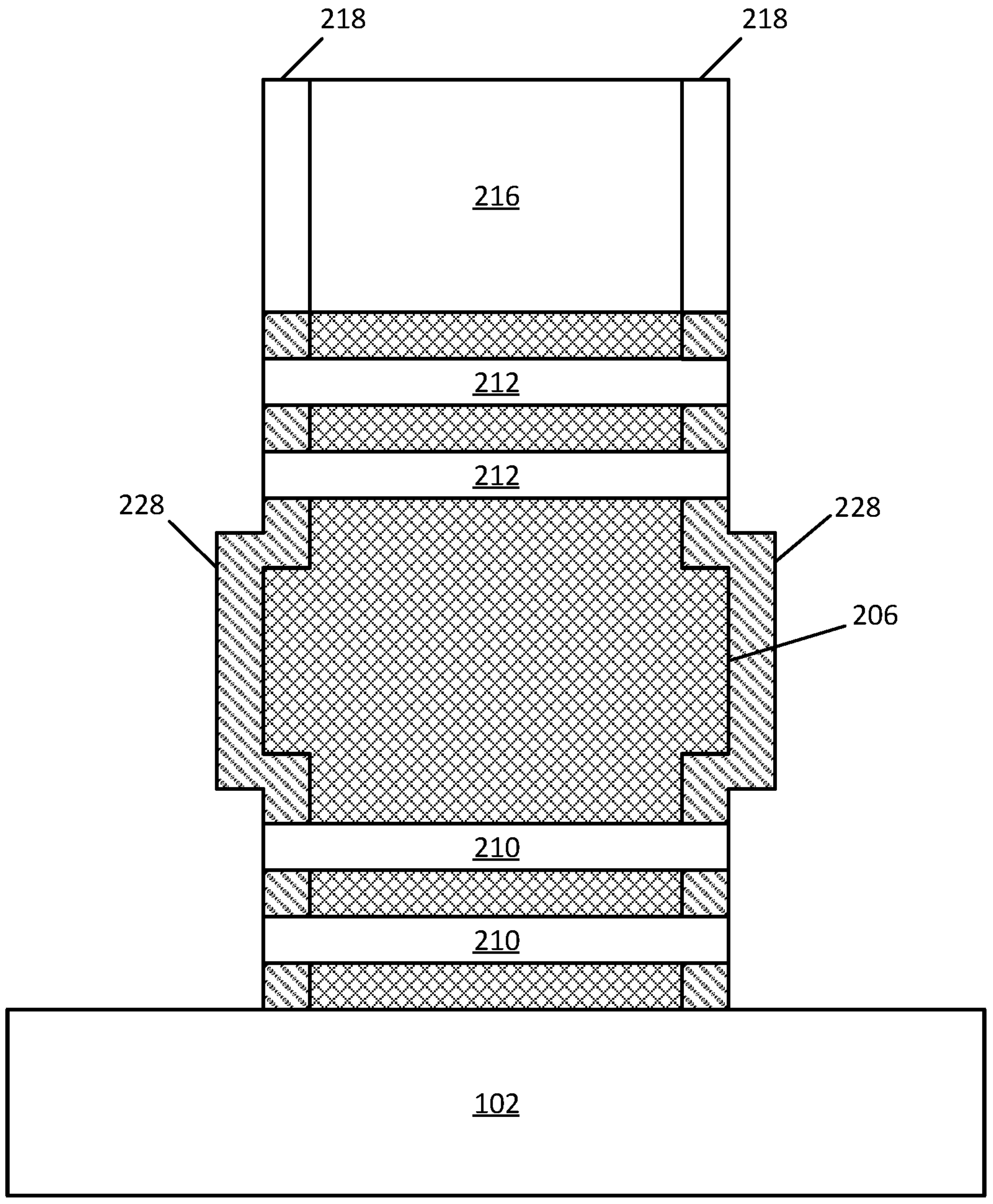

FIG. 2I illustrates a cross-sectional view of the structure shown in FIG. 2H following the formation of internal spacers 228, according to an embodiment of the present disclosure. Prior to the formation of internal spacers 228, second sacrificial material 226 and any remaining portion of liner 222 may be removed using one or more isotropic etching processes. In some embodiments, a brief isotropic etch may be performed on spacer layer 206 to smooth out the laterally protruding sections.

Internal spacers 228 may have a material composition that is similar to or the exact same as spacer structures 218. Accordingly, internal spacers 228 may be any suitable dielectric material that exhibits high etch selectively to semiconductor materials such as silicon and/or silicon germanium. In some embodiments, a low-k dielectric material is used for internal spacers 228. Internal spacers 228 may be conformally deposited over the sides of the fin structure using a CVD process like ALD.

According to some embodiments, internal spacers 228 conformally form around and between the ends of first semiconductor layers 210 and second semiconductor layers 212 and are etched back using an isotropic etching process to uniformly recess internal spacers 228 until at least the ends of both first semiconductor layers 210 and second semiconductor layers 212 are exposed. According to some embodiments, internal spacers 228 also form over the stepped sidewall topography of spacer layer 206. The conformal geometry of internal spacers 228 over spacer layer 206 yields a corresponding stepped or outwardly curved profile to internal spacers 228 in the region between first semiconductor layers 210 and second semiconductor layers 212.

Figure 2J:
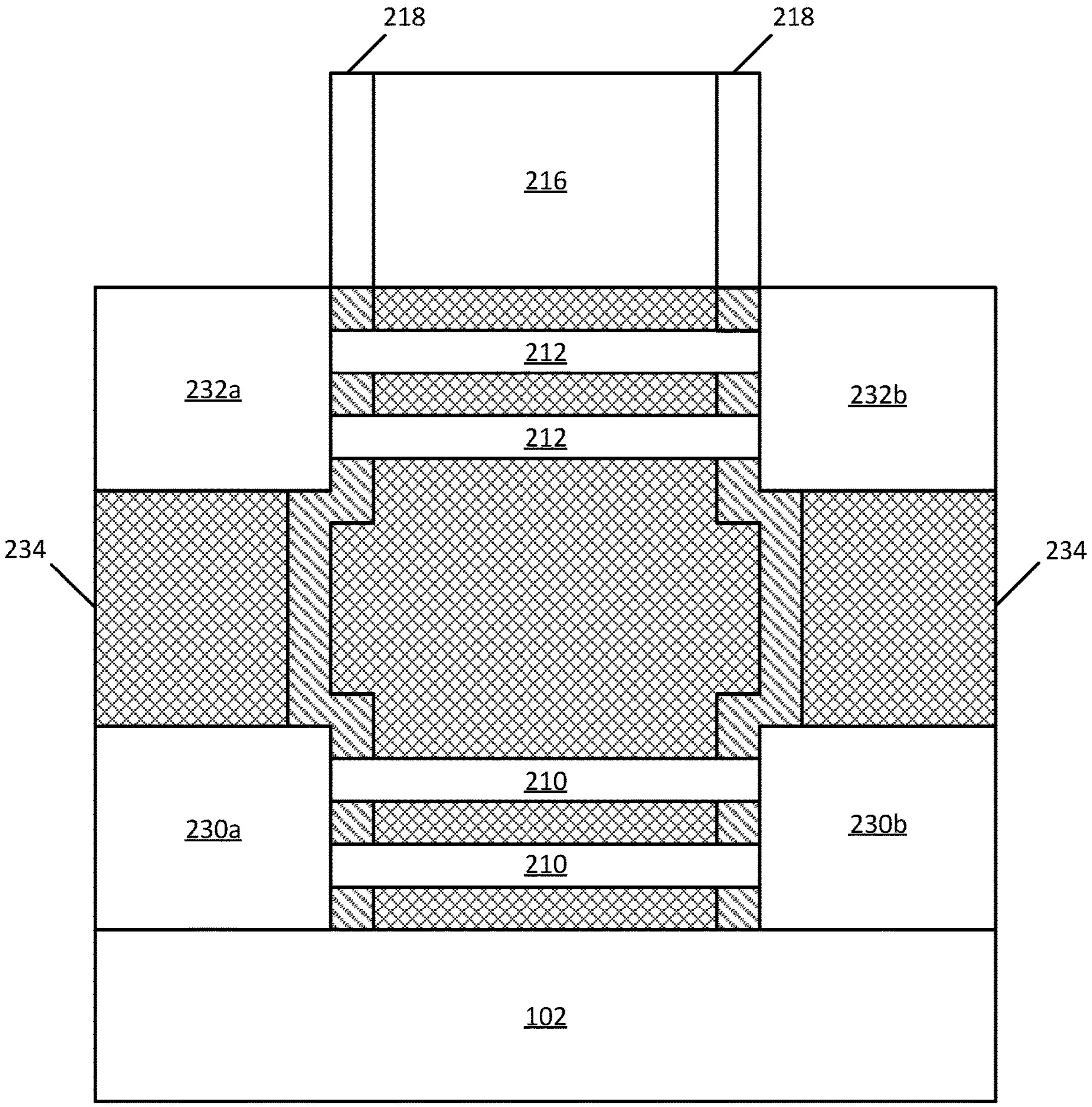

FIG. 2J illustrates a cross-sectional view of the structure shown in FIG. 2I following the formation of source and drain regions, according to an embodiment of the present disclosure. Due to the vertically stacked spacing between first semiconductor layers 210 and second semiconductor layers 212, a similarly stacked formation of source and drain regions is created. According to an embodiment, a first source region 230*a* and a first drain region 230*b* are formed at either ends of first semiconductor layers 210. In some examples, first source and drain regions 230*a*/230*b* are epitaxially grown over substrate 102. Any semiconductor materials suitable for first source and drain regions 230*a*/230*b* can be used (e.g., group IV and group III-V semiconductor materials). First source and drain regions 230*a*/230*b* may include multiple layers such as liners and capping layers to improve contact resistance. In any such cases, the composition and doping of first source and drain regions 230*a*/230*b* may be the same or different, depending on the polarity of the transistor. In one example, first semiconductor layers 210 are doped with n-type dopants and first source or drain regions 230*a*/230*b* include a high concentration of p-type dopants (PMOS transistor). Any number of source and drain configurations and materials can be used.

According to an embodiment, a second source region 232*a* and a second drain region 232*b* are formed at either ends of second semiconductor layers 212. In some examples, second source or drain regions 232*a*/232*b* are epitaxially grown over an insulator layer 234. Any semiconductor materials suitable for second source and drain regions 232*a*/232*b* can be used (e.g., group IV and group III-V semiconductor materials). Second source and drain regions 232*a*/232*b* may include multiple layers such as liners and capping layers to improve contact resistance. In any such cases, the composition and doping of second source or drain regions 232*a*/232*b* may be the same or different, depending on the polarity of the transistor. In one example, second semiconductor layers 212 are doped with p-type dopants and second source and drain regions 232*a*/232*b* include a high concentration of n-type dopants (NMOS transistor). Any number of source and drain configurations and materials can be used.

According to some embodiments, insulator layer 234 is formed between vertically adjacent source regions 230*a* and 232*a* and vertically adjacent drain regions 230*b* and 232*b*. Insulator layer 234 may be any suitable dielectric material with a thickness sufficient to provide electrical isolation between the source and drain regions.

Figure 2K:
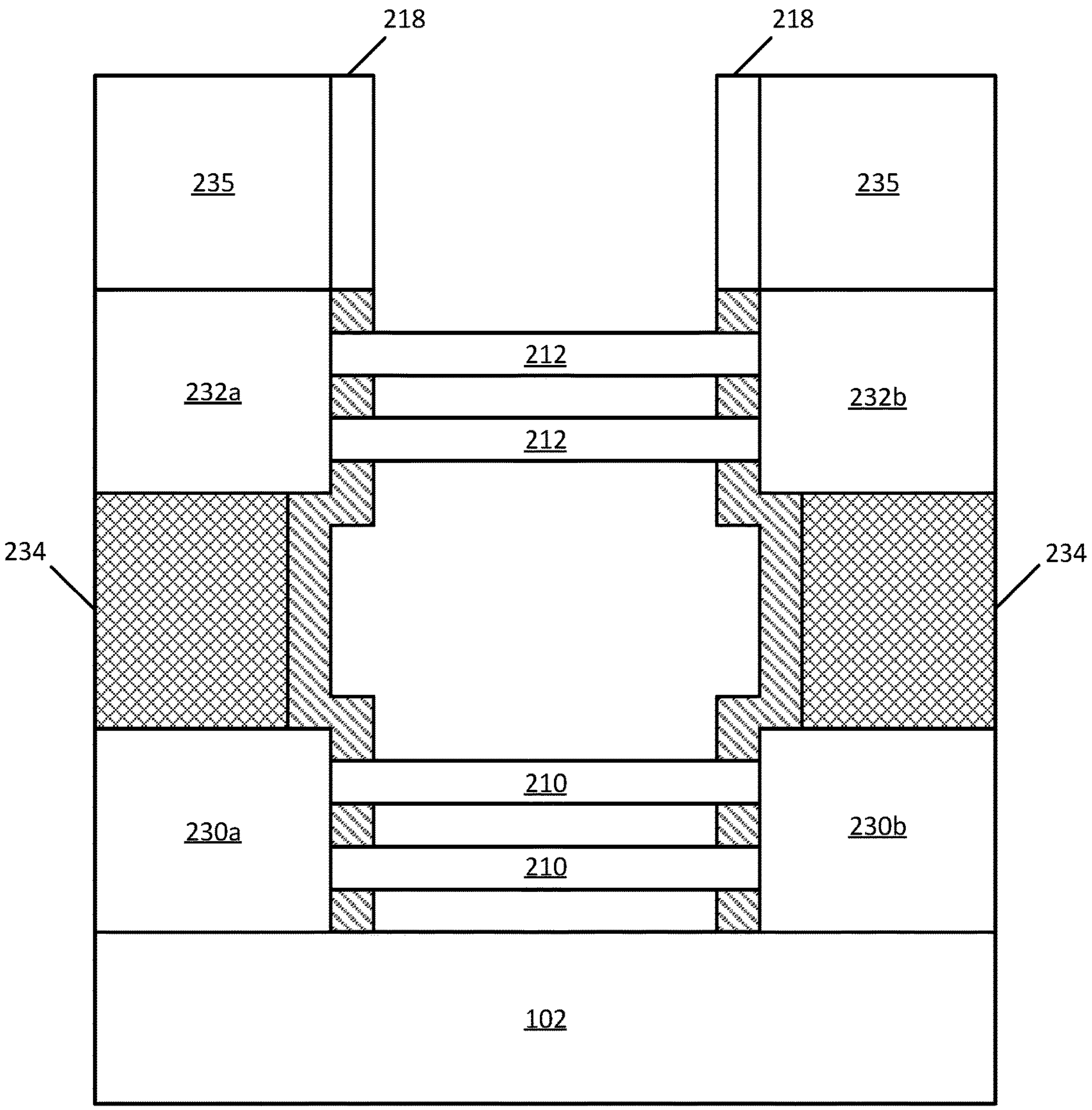

FIG. 2K illustrates a cross-sectional view of the structure shown in FIG. 2J following deposition of an insulating layer 235 and planarization of the structure (e.g., via chemical mechanical planarization, CMP) and the removal of the sacrificial gate structure 216, sacrificial layers 208, and spacer layer 206, according to an embodiment of the present disclosure. Sacrificial gate structure 216 may be removed using any wet or dry isotropic process thus exposing the alternating layer stack of the fin within the trench left behind after the removal of sacrificial gate structure 216. Once sacrificial gate structure 216 has been removed, sacrificial layers 208 and spacer layer 206 may also be removed using a selective isotropic etching process that removes the material of sacrificial layers 208 and spacer layer 206 but does not remove (or removes very little of) first semiconductor layers 210 and second semiconductor layers 212. At this point, the suspended (sometimes called released) first semiconductor layers 210 form nanoribbons or nanowires that extend between first source and drain regions 230*a*/230*b* and the suspended second semiconductor layers 212 form nanoribbons or nanowires that extend between second source and drain regions 232*a*/232*b*. Insulating layer 235 can be any suitable dielectric material, such as those discussed with reference to insulating layer 122.

Figure 2L:
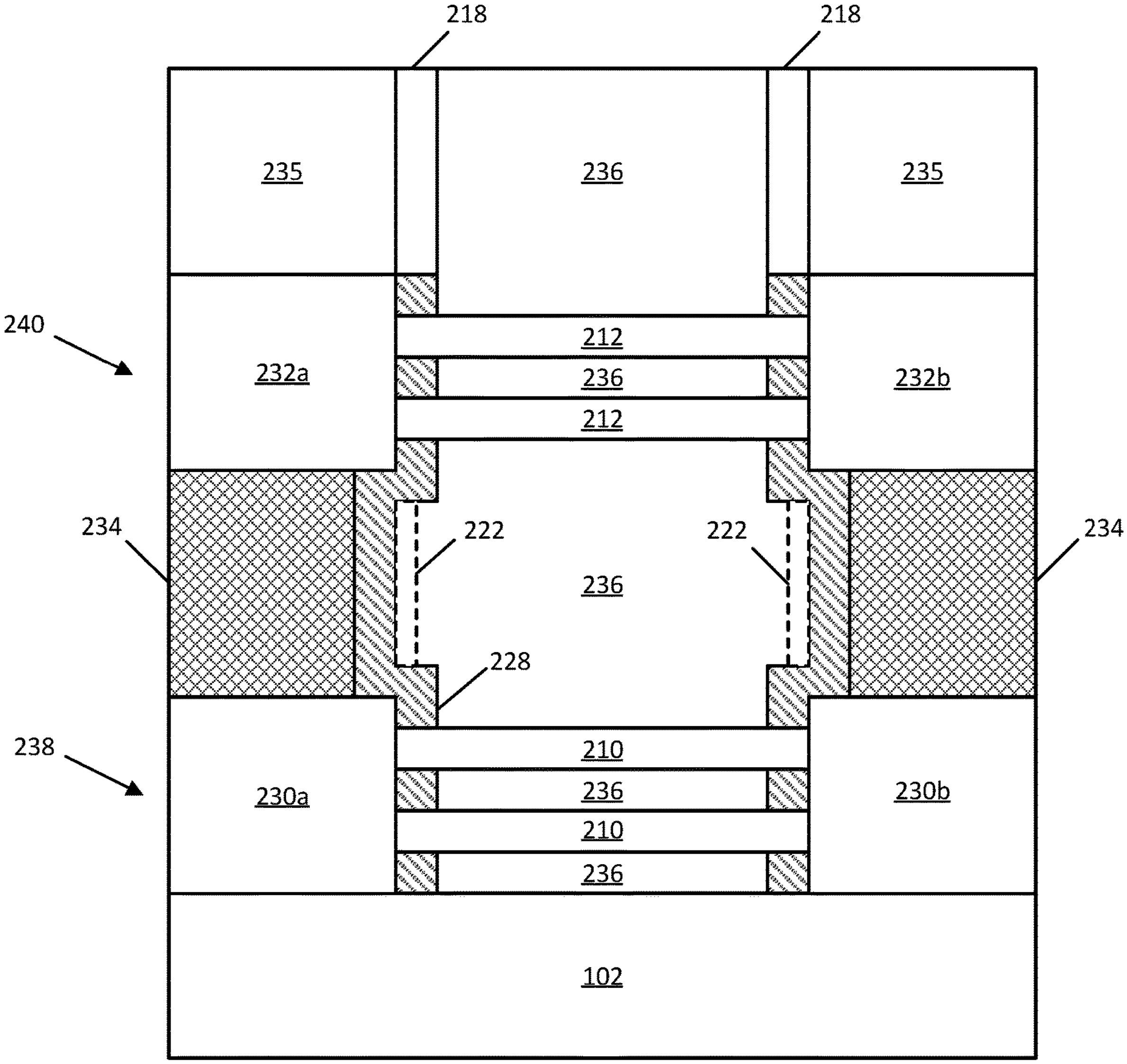
Figure 2L:
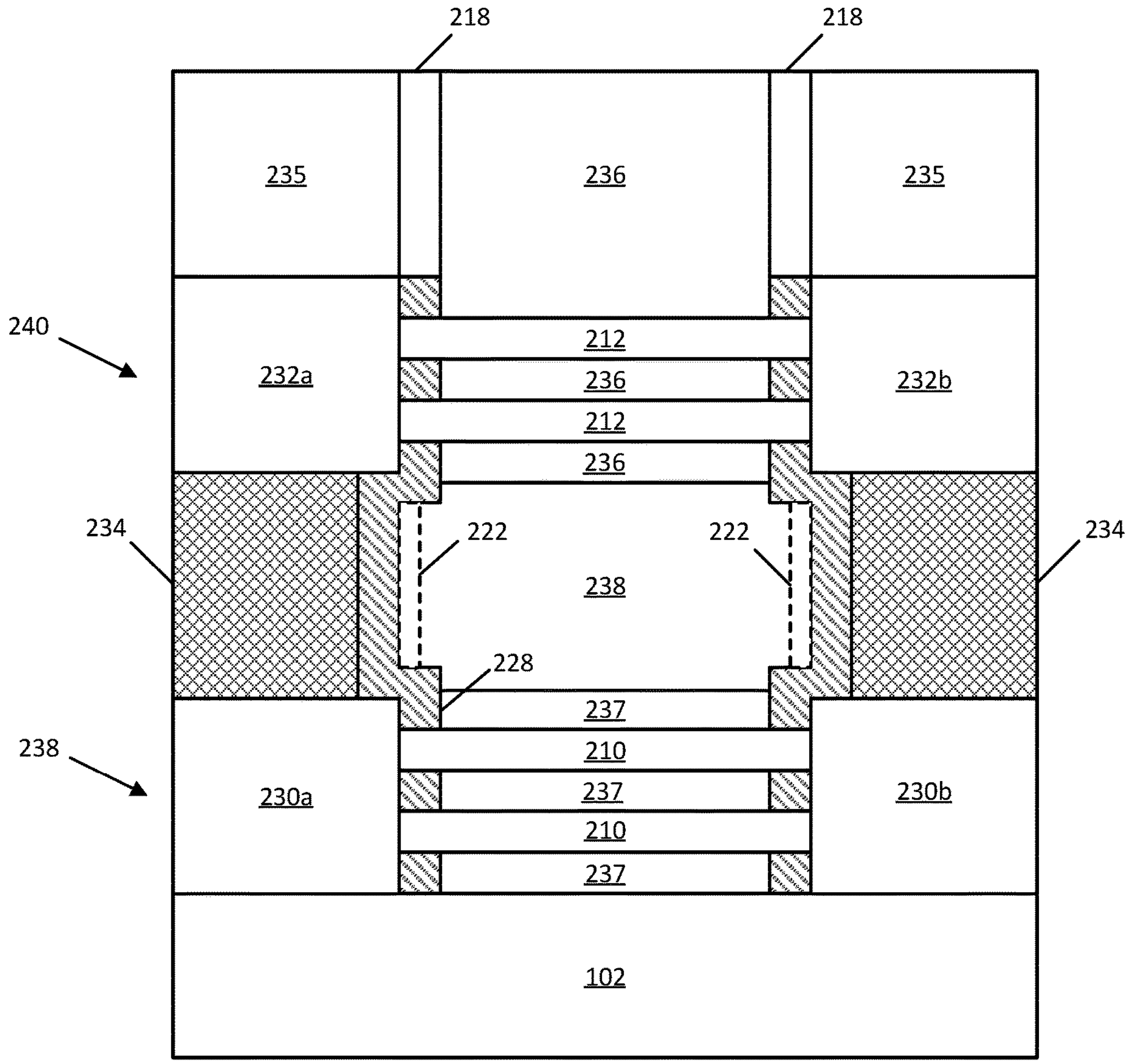

FIG. 2L illustrates a cross-sectional view of the structure shown in FIG. 2K following the formation of a gate structure 236 around the suspended first semiconductor layers 210 and second semiconductor layers 212, according to an embodiment of the present disclosure. As noted above, gate structure 236 includes a gate dielectric and a gate electrode.

The gate dielectric may be conformally deposited around first semiconductor layers 210 and second semiconductor layers 212 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on first and second semiconductor layers 210/212, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-K material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Recall the workfunction for the lower channel region can be different from the upper channel region, according to some example embodiments.

In the illustrated embodiment of FIG. 2L, gate structure 236 extends into the recesses of the stepped portion of internal spacer 228 extending between first semiconductor layers 210 of a first semiconductor device 238 and second semiconductor layers 212 of a second semiconductor device 240. Accordingly, gate structure 236 has a greater width in the stepped region between first semiconductor layers 210 and second semiconductor layers 212 compared to a width of gate structure 236 adjacent to first semiconductor layers 210 and adjacent to second semiconductor layers 212. In some embodiments, gate structure 236 is between about 5 nm and about 10 nm wider in the stepped region between first semiconductor layers 210 and second semiconductor layers 212 compared to the regions at both first semiconductor layers 210 and second semiconductor layers 212. Recall, for example, distance D1 and distance D2, with reference to FIGS. 1A and 1B. Further recall that the stepped portion of internal spacers 222 can be curvilinear or otherwise have non-straight features making up the recess effectively formed by the stepped portion.

According to some embodiments, liner layer 222 remains in the final structure as illustrated by the dotted lines. In such examples, liner layer 222 may be present between gate structure 236 and internal spacer 228 extending between first semiconductor layers 210 of a first semiconductor device 238 and second semiconductor layers 212 of a second semiconductor device 240. Further note that liner layer 222 effectively may be present within the recess of the stepped portion, such that at least a portion of layer 222 is between an upper portion of internal spacer 228 (that extends along upper source region 232*a* or upper drain region 232*b*) and a lower portion of internal spacer 228 (that extends along lower source region 230*a* or upper drain region 230*b*). The previous relevant discussion with respect to gate structure materials being within the recesses is equally applicable here, including one or more workfunction metals. Note in some cases that include liner layer 222, there may also be a gate dielectric conformally deposited within the recesses, such that the gate dielectric is between liner layer 222 and the gate electrode of gate structure 236. In some such cases, there may be one or more workfunction metals in the recesses as well.

FIG. 2L' illustrates a cross-sectional view of the structure shown in FIG. 2K following the formation of a lower gate structure 237 around the released first semiconductor layers 210 and an upper gate structure 236 around the released second semiconductor layers 212, along with isolation structure 238, according to another embodiment of the present disclosure. The previous relevant discussion for each of the depicted features is equally applicable here. Note that the lower gate structure 237 may be configured differently from the upper gate structure 236, or the same. In one example case, the lower gate structure 237 and the upper gate structure 236 include the same gate dielectric and gate electrode fill metal (if any), but include different workfunction materials in their respective gate electrodes. For instance, one of the upper or lower gate electrode may include a p-type workfunction material (e.g., titanium nitride) and the other of the upper or lower gate electrode may include an n-type workfunction material (e.g., titanium aluminum carbide). The isolation structure 238 can be any suitable dielectric material, such as silicon oxide, and may be the same material, for instance, as insulating layers 234 and/or 235. In some cases, the lower gate structure 237 materials are deposited on both the lower and upper channel regions, followed by an etch-back process to remove those materials from the upper channel region. Then, isolation structure 238 can be deposited within the gate trench on top of the lower gate structure 237, and recessed to a desired level. Then the upper gate structure 236 materials can be deposited. Note in the example embodiment shown that the isolation structure 238 extends above and below the stepped portions of the spacers 228 in this example, but in other examples, may be completely within and between the stepped portions of the spacers 228. The previous relevant discussion with respect to the recesses (stepped portions) including one or more workfunction metals and/or gate dielectric material(s), as well as symmetry (or asymmetry, as the case may be) of the gate structures 236 and 237, is equally applicable here.

Figure 3:
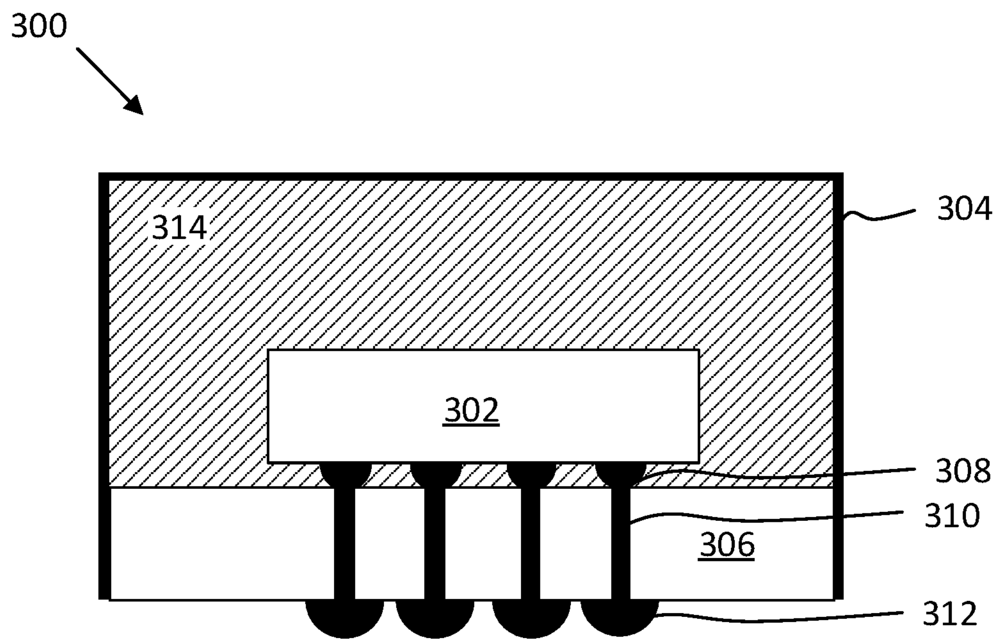
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
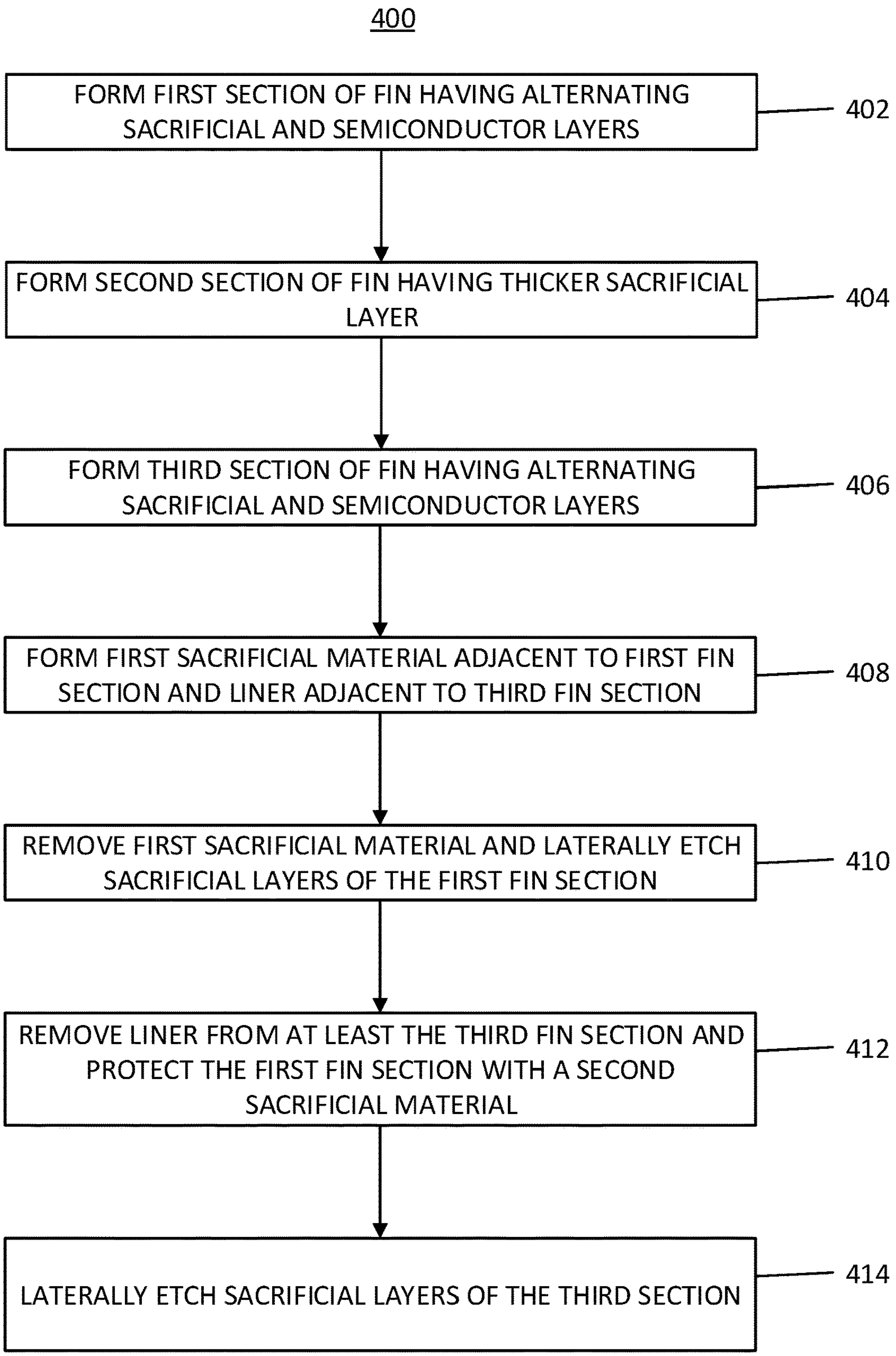
FIG. 4 is a flowchart of a fabrication process for an integrated circuit with a particular spacer structure geometry, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2L'. However, the correlation of the various operations of method 400 to the specific components illustrated in the aforementioned figures is not intended to imply any structural and/or use limitations. Rather, the aforementioned figures provide some example embodiments of method 400. Other operations may be performed before, during, or after any of the operations of method 400. Some of the operations of method 400 may be performed in a different order than the illustrated order.

Method 400 begins with operation 402 where a first section of a fin is formed having alternating sacrificial and semiconductor layers. The sacrificial layers may include SiGe while the semiconductor layers may be Si, SiGe, Ge, InP, or GaAs, to name a few examples. The first section may be formed over a substrate. The thickness of each of the sacrificial and semiconductor layers may be between about 5 nm and about 20 nm or between about 5 nm and about 10 nm. Each of the sacrificial and semiconductor layers may be deposited using any known material deposition technique, such as CVD, PECVD, PVD, or ALD.

Method 400 continues with operation 404 where a second section of the fin is formed having a thicker sacrificial layer. The thicker sacrificial layer may be substantially the same material as the sacrificial layers of the first fin section. According to some embodiments, a thickness of the thicker sacrificial layer may be between about 30 nm and about 80 nm. The thicker sacrificial layer may be deposited using any known material deposition technique, such as CVD, PECVD, PVD, or ALD.

Method 400 continues with operation 406 where a third section of the fin is formed having alternating sacrificial and semiconductor layers. Each of the sacrificial and semiconductor layers of the third fin section may be substantially the same material, and may have substantially the same thicknesses, as the sacrificial and semiconductor layers of the first fin section. In some other embodiments, the semiconductor layers of the first fin section include a different material compared to the semiconductor layers of the third fin section. For example, the first fin section may have semiconductor layers that are Si having p-type dopants and the third fin section may have semiconductor layers that are Si having n-type dopants. Each of the sacrificial and semiconductor layers of the third fin may be deposited using any known material deposition technique, such as CVD, PECVD, PVD, or ALD.

According to some embodiments, once the material layers have been deposited, one or more fins may be defined via an anisotropic etching process, such as RIE, using a patterned mask material to protect the fins from the etch. The fin height may include the alternating material layers of each of the three sections and a sub fin portion formed from the substrate material. In some other embodiments, trenches are first formed in a dielectric material and the alternating material layers of the three aforementioned sections are formed within the trenches to form one or more multilayer fins. Individual fins may be further defined by patterning a sacrificial gate and spacer structures, then etching around the sacrificial gate and spacer structures via an anisotropic etching process, such as RIE.

Method 400 continues with operation 408 where a first sacrificial material is formed adjacent to the first fin section and a liner is formed adjacent to the third fin section. The first sacrificial material may be deposited over and around the fin and then recessed back using an isotropic etching process to a height that is at least greater than a thickness of the first fin section. Accordingly, the first sacrificial material contacts the sidewall of at least the first fin section, in some embodiments. The first sacrificial material may be any carbon-based material that can be removed using an ashing process. In some examples, the first sacrificial material includes a carbon hard mask (CHM) material. In some examples, the first sacrificial material includes silicon and carbon along with any amount of oxygen and/or nitrogen.

Following the formation of the first sacrificial material, a liner may be formed over the remaining sidewalls of the fin, such that the liner is formed at least over the sidewalls of the third fin section. The liner may include any metal nitride material deposited using atomic layer deposition (ALD). In one example, the liner includes titanium nitride (TiN). The liner may be deposited to an average thickness between about 1 nm and about 5 nm.

Method 400 continues with operation 410 where the first sacrificial material is removed and the exposed sacrificial layers of the first fin section are laterally etched. An anisotropic etching process may first be performed to remove any portion of the liner over the top surface of the first sacrificial material. An isotropic etching process (e.g., ashing) may be used to remove the first sacrificial material, thus exposing the ends of the semiconductor layers and the sacrificial layers of the first fin section.

An isotropic etching process may be used to recess the exposed ends of each of the sacrificial layers of the first fin section. Due to the presence of the liner, the sacrificial layers of the third fin section are protected and are not etched. According to some embodiments, the liner also protects at least a portion of the thicker sacrificial layer from being etched, which allows for a more controlled etching process when recessing each of the sacrificial layers of the first fin section.

Method 400 continues with operation 412 where the liner adjacent to at least the third fin section is removed and a second sacrificial material is formed adjacent to at least the first fin section. The second sacrificial material may be deposited over and around the fin and then recessed back using an isotropic etching process to a height that is at least above the thickness of the first fin section, but below the third fin section (such that the second sacrificial material is adjacent to the first fin section but not the third fin section). The second sacrificial material may be any carbon-based material that can be removed using an ashing process, similar to the first sacrificial material.

Following the formation of the second sacrificial material, the exposed portion of liner along the sidewalls of the fin may be removed using an isotropic etching process. Accordingly, the liner is removed from adjacent to the third fin section, thus exposing the ends of the sacrificial and semiconductor layers of the third fin section. According to some embodiments, a portion of the thicker sacrificial layer above the top surface of the second sacrificial material is also exposed by removing the liner.

Method 400 continues with operation 414 where the exposed sacrificial layers of the third fin section are laterally etched. An isotropic etching process may be used to recess the exposed ends of each of the sacrificial layers of the third fin section. Due to the presence of the second sacrificial material, the sacrificial layers of the first fin section are protected and are not etched. According to some embodiments, the second sacrificial material also protects at least a portion of the thicker sacrificial layer from being etched, which allows for a more controlled etching process when recessing each of the sacrificial layers of the third fin section.

Once a controlled etching process has been performed to separately recess the sacrificial layers of the first and third fin sections, an inner spacer structure can be formed around the exposed ends of the semiconductor layers of each of the first and third fin sections.

Example System

Figure 5:
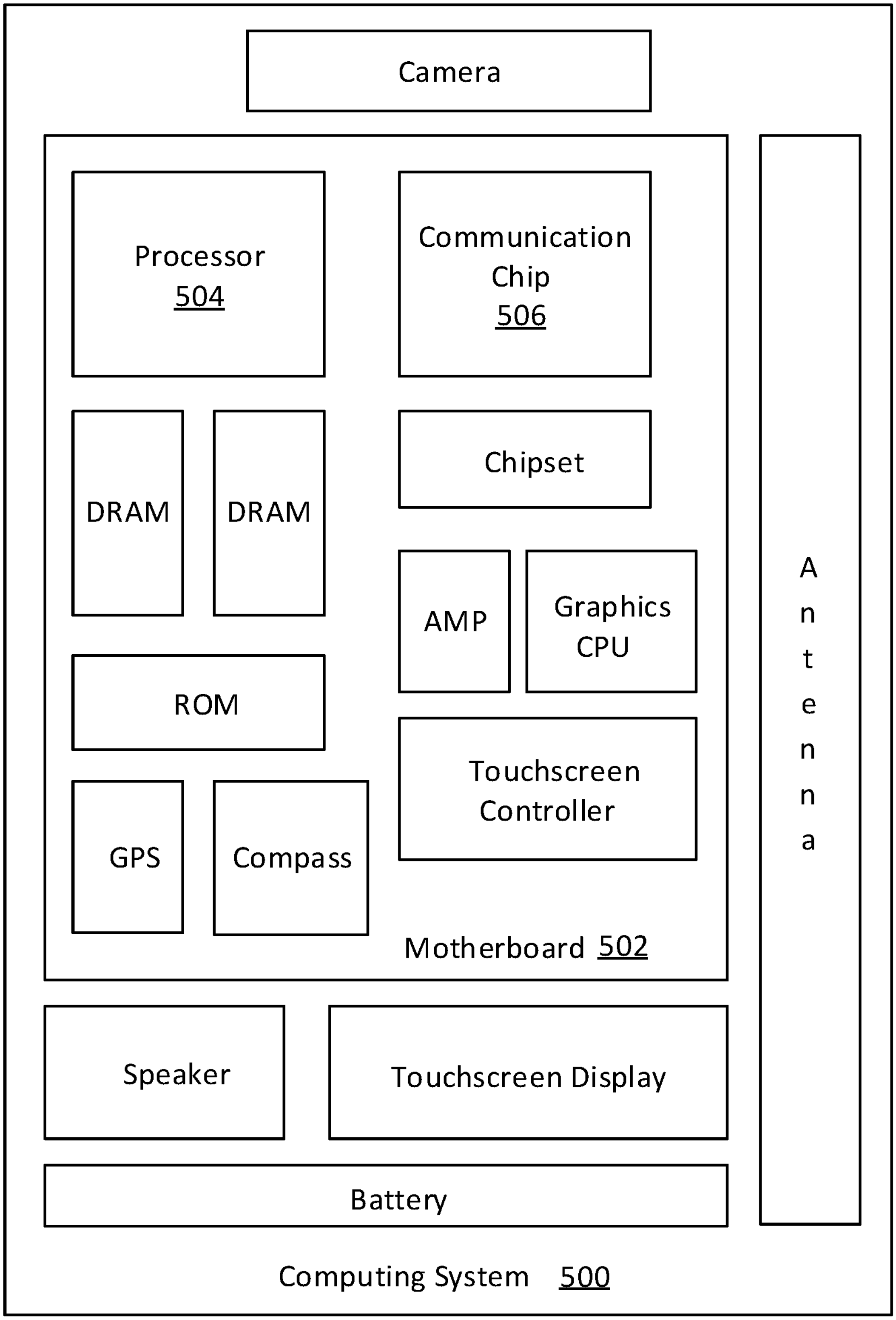
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit device on a substrate, the substrate having a stacked configuration of semiconductor devices, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor body extending in a first direction between a first source region and a first drain region, and a second semiconductor body extending in the first direction between a second source region and a second drain region, where the first semiconductor body is spaced vertically from the second semiconductor body in a second direction orthogonal to the first direction. The integrated circuit further includes a first spacer structure having a first portion extending along the first source region, a second portion extending along the second source region, and a third portion connecting the first and second portions of the first spacer structure; and a second spacer structure having a first portion extending along the first drain region, a second portion extending along the second drain region, and a third portion connecting the first and second portions of the second spacer structure. A maximum horizontal distance between the third portion of the first spacer structure and the third portion of the second spacer structure is more than 1 nm longer than the maximum horizontal distance between the first portion of the first spacer structure and the first portion of the second spacer structure.

Example 2 includes the subject matter of Example 1, further comprising a first gate structure around the first semiconductor body; a second gate structure around the second semiconductor body; and an isolation structure between the first gate structure and the second gate structure.

Example 3 includes the subject matter of Example 2, wherein the first gate structure includes a first metal and the second gate structure includes a second metal that is elementally different from the first metal.

Example 4 includes the subject matter of Example 1, comprising a gate structure around the first semiconductor body as well as the second semiconductor body.

Example 5 includes the subject matter of Example 4, wherein a first portion of the gate structure that is around the first semiconductor body includes a first metal, and a second portion of the gate structure that is around the second semiconductor body includes a second metal that is elementally different from the first metal.

Example 6 includes the subject matter of any one of Examples 1-5, wherein the first semiconductor body and the second semiconductor body are both nanoribbons.

Example 7 includes the subject matter of Example 6, wherein the first semiconductor nanoribbon is n-type silicon and the second nanoribbon is p-type silicon.

Example 8 includes the subject matter of any one of Examples 1-7, wherein a vertical distance between the first semiconductor body and the second semiconductor body is between 30 nm and 80 nm.

Example 9 includes the subject matter of any one of Examples 1-8, further comprising a layer including nitrogen and a metal, the layer laterally between the third portion of the first or second spacer structure and a gate structure and/or an isolation structure.

Example 10 includes the subject matter of Example 9, wherein the metal comprises titanium.

Example 11 includes the subject matter of any one of Examples 1-10, wherein the maximum horizontal distance between the third portion of the first spacer structure and the third portion of the second spacer structure is between 5 nm and 10 nm greater than the maximum horizontal distance between the first portion of the first spacer structure and the first portion of the second spacer structure.

Example 12 is a printed circuit board comprising the integrated circuit of any one of Examples 1-11.

Example 13 is a microprocessor comprising the integrated circuit of any one of Examples 1-11.

Example 14 is a memory chip comprising the integrated circuit of any one of Examples 1-11.

Example 15 is an integrated circuit that includes a first semiconductor nanoribbon extending between a first source region and a first drain region, a second semiconductor nanoribbon extending between a second source region and a second drain region, where the second nanoribbon is directly above and spaced from the first semiconductor nanoribbon, a first spacer structure having a first portion extending along the first source region, a second portion extending along the second source region, and a third portion connecting the first and second portions of the first spacer structure, and a second spacer structure having a first portion extending along the first drain region, a second portion extending along the second drain region, and a third portion connecting the first and second portions of the second spacer structure. A horizontal distance between the third portion of the first spacer structure and the third portion of the second spacer structure is more than 5 nm longer than the maximum horizontal distance between the first portion of the first spacer structure and the first portion of the second spacer structure.

Example 16 includes the subject matter of Example 15, further comprising a first gate structure that wraps around the first semiconductor nanoribbon; a second gate structure that wraps around the second semiconductor nanoribbon; and an isolation structure between the first gate structure and the second gate structure.

Example 17 includes the subject matter of Example 16, wherein the first gate structure includes a first metal and the second gate structure includes a second metal that is elementally different from the first metal.

Example 18 includes the subject matter of Example 15, comprising a gate structure that wraps around the first semiconductor nanoribbon as well as the second semiconductor nanoribbon.

Example 19 includes the subject matter of Example 18, wherein a first portion of the gate structure that wraps around the first semiconductor nanoribbon includes a first metal, and a second portion of the gate structure that wraps around the second semiconductor nanoribbon includes a second metal that is elementally different from the first metal.

Example 20 includes the subject matter of any one of Examples 15-19, wherein the first nanoribbon is one of a first plurality of nanoribbons that extend between the first source region and the first drain region, and the second nanoribbon is one of a second plurality of nanoribbons that extend between the second source region and the second drain region.

Example 21 includes the subject matter of any one of Examples 15-20, wherein the first nanoribbon is an uppermost nanoribbon of the first plurality of nanoribbons, and the second nanoribbon is a lowermost nanoribbon of the second plurality of nanoribbons, and a vertical distance between the first semiconductor nanoribbon and the second semiconductor nanoribbon is between 30 nm and 80 nm.

Example 22 includes the subject matter of any one of Examples 15-21, further comprising a first layer including nitrogen and a metal, the first layer laterally between the third portion of the first spacer structure and a gate structure and/or an isolation structure; and a second layer including nitrogen and the metal, the second layer laterally between the third portion of the second spacer structure and the gate structure and/or the isolation structure.

Example 23 includes the subject matter of Example 22, wherein the metal comprises titanium.

Example 24 includes the subject matter of any one of Examples 15-23, wherein the maximum horizontal distance between the third portion of the first spacer structure and the third portion of the second spacer structure is between 5 nm and 10 nm greater than the maximum horizontal distance between the first portion of the first spacer structure and the first portion of the second spacer structure.

Example 25 is a printed circuit board comprising the integrated circuit of any one of Examples 15-24.

Example 26 is a microprocessor comprising the integrated circuit of any one of Examples 15-24.

Example 27 is a memory chip comprising the integrated circuit of any one of Examples 15-24.

Example 28 is an electronic device that includes a chip package comprising one or more dies. At least one of the one or more dies includes a semiconductor device having a first plurality of semiconductor nanoribbons extending in a first direction between a first source region and a first drain region and a second plurality of semiconductor nanoribbons extending in the first direction between a second source region and a second drain region, where the first plurality of semiconductor nanoribbons are spaced vertically from the second plurality of semiconductor nanoribbons in a second direction orthogonal to the first direction. The at least one of the one or more dies further includes a spacer structure that extends between the first plurality of semiconductor nanoribbons and the second plurality of semiconductor nanoribbons in the second direction, and a gate structure around both the first plurality of semiconductor nanoribbons and the second plurality of semiconductor nanoribbons. The gate structure has a first width at the first plurality of semiconductor nanoribbons, has the first width at the second plurality of semiconductor nanoribbons, and has a second width greater than the first width between the first plurality of semiconductor nanoribbons and the second plurality of semiconductor nanoribbons.

Example 29 includes the subject matter of Example 28, wherein the first plurality of semiconductor nanoribbons and the second plurality of semiconductor nanoribbons comprise germanium, silicon, or any combination thereof.

Example 30 includes the subject matter of Example 29, wherein the first plurality of semiconductor nanoribbons is n-type silicon and the second plurality of semiconductor nanoribbons is p-type silicon.

Example 31 includes the subject matter of any one of Examples 28-30, wherein a vertical distance between the first plurality of semiconductor nanoribbons and the second plurality of semiconductor nanoribbons is between 30 nm and 80 nm.

Example 32 includes the subject matter of any one of Examples 28-31, wherein the at least one of the one or more dies further comprises a metal nitride layer along a sidewall portion of the gate structure between the first plurality of semiconductor nanoribbons and the second plurality of semiconductor nanoribbons.

Example 33 includes the subject matter of Example 32, wherein the metal nitride layer comprises titanium and nitrogen.

Example 34 includes the subject matter of any one of Examples 28-33, wherein the second width of the gate structure is between 5 nm and 10 nm greater than the first width of the gate structure.

Example 35 includes the subject matter of any one of Examples 28-34, further comprising a printed circuit board, wherein the chip package is attached to the printed circuit board.

Example 36 is a method of forming an integrated circuit. The method includes forming a first section of a multilayer fin, the first section including first material layers alternating with second material layers, the second material layers comprising a semiconductor material suitable for use as a nanoribbon channel; forming a second section of the multilayer fin over the first section, the second section having a third material layer that is compositionally the same as the first material layers, wherein the third material layer is thicker than the first material layers; forming a third section of the multilayer fin over the second section, the third section including fourth material layers alternating with fifth material layers, wherein the fourth material layers are compositionally the same as the first and third material layers, and the fifth material layers comprise a semiconductor material suitable for use as a nanoribbon channel; forming a first sacrificial material adjacent to the first section of the multilayer fin; forming a liner over a sidewall of at least the third section of the multilayer fin; removing the first sacrificial material and laterally etching portions of the first material layers; forming a second sacrificial material adjacent to the first section of the multilayer fin; removing a portion of the liner over the sidewall of the third section of the multilayer fin and laterally etching portions of the fourth material layers; removing the second sacrificial material; and forming an inner spacer structure around exposed ends of the second and fifth material layers.

Example 37 includes the subject matter of Example 36, wherein the first, third, and fourth material layers comprise silicon and germanium and the second and fifth material layers comprise silicon.

Example 38 includes the subject matter of Example 36 or 37, wherein the first and fourth material layers have a thickness between about 5 nm and about 10 nm and the third material layer has a thickness between about 30 nm and about 80 nm.

Example 39 includes the subject matter of any one of Examples 36-38, further comprising removing the first, third, and fourth material layers.

Example 40 includes the subject matter of Example 39, further comprising forming a gate structure around portions of the second material layers and around portions of the fifth material layers.

Example 41 includes the subject matter of any one of Examples 36-40, further comprising doping the second material layers with p-type dopants and doping the fifth material layers with n-type dopants.

Example 42 includes the subject matter of any one of Examples 36-41, wherein laterally etching portions of the first material layers also etches a portion of the third material layer.

Example 43 includes the subject matter of any one of Examples 36-42, wherein laterally etching portions of the fourth material layers also etches a portion of the third material layer.

Example 44 includes the subject matter of any one of Examples 36-43, wherein the second sacrificial material is also formed adjacent to a portion of the second section of the multilayer fin.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a first semiconductor body extending in a first direction between a first source region and a first drain region and a second semiconductor body extending in the first direction between a second source region and a second drain region, the first semiconductor body spaced from the second semiconductor body in a second direction orthogonal to the first direction;

a first spacer structure having a first portion extending in the second direction along a side of the first source region, a second portion extending in the second direction along a side of the second source region, and a third portion connecting the first and second portions of the first spacer structure, each of the first, second, and third portions of the first spacer structure being a first same body of continuous material; and a second spacer structure having a first portion extending in the second direction along a side of first drain region, a second portion extending in the second direction along a side of second drain region, and a third portion connecting the first and second portions of the second spacer structure, each of the first, second, and third portions of the second spacer structure being a second same body of continuous material;

wherein a maximum distance along the first direction between the third portion of the first spacer structure and the third portion of the second spacer structure is more than 1 nm longer than a maximum distance along the first direction between the first portion of the first spacer structure and the first portion of the second spacer structure, and wherein the third portion of the first spacer structure is further laterally outward than the first and second portions of the first spacer structure, and the third portion of the second spacer structure is further laterally outward than the first and second portions of the second spacer structure.

2. The integrated circuit of claim 1, comprising:

a first gate structure around the first semiconductor body;

a second gate structure around the second semiconductor body; and an isolation structure between the first gate structure and the second gate structure along the second direction.

3. The integrated circuit of claim 1, comprising a gate structure around the first semiconductor body as well as the second semiconductor body.

4. The integrated circuit of claim 1, wherein the first semiconductor body and the second semiconductor body both comprise one or more nanoribbons.

5. The integrated circuit of claim 1, wherein the first source region and the first drain region comprise n-type dopants and the second source region and the second drain region comprise p-type dopants.

6. The integrated circuit of claim 1, wherein a distance along the second direction between the first semiconductor body and the second semiconductor body is between 30 nm and 80 nm.

7. The integrated circuit of claim 1, further comprising a layer including nitrogen and a metal, the layer between the third portion of the first or second spacer structure and a gate structure and/or an isolation structure along the first direction.

8. The integrated circuit of claim 1, further comprising a die that includes each of the first semiconductor body, the second semiconductor body, the first spacer structure, and the second spacer structure.

9. An integrated circuit comprising:

a first semiconductor nanoribbon extending along a first direction between a first source region and a first drain region;

a second semiconductor nanoribbon extending along the first direction between a second source region and a second drain region, the second semiconductor nanoribbon spaced above the first semiconductor nanoribbon in a second direction different from the first direction;

a first spacer structure having a first portion extending in the second direction along a side of the first source region, a second portion extending in the second direction along a side of the second source region, and a third portion connecting the first and second portions of the first spacer structure, each of the first, second, and third portions of the first spacer structure being a same continuous material; and a second spacer structure having a first portion extending in the second direction along a side of the first drain region, a second portion extending in the second direction along a side of the second drain region, and a third portion connecting the first and second portions of the second spacer structure, each of the first, second, and third portions of the second spacer structure being a same continuous material;

wherein a maximum distance along the first direction between the third portion of the first spacer structure and the third portion of the second spacer structure is more than 5 nm longer than a maximum distance along the first direction between the first portion of the first spacer structure and the first portion of the second spacer structure, and wherein the third portion of the first spacer structure outwardly protrudes from the first and second portions of the first spacer structure, and the third portion of the second spacer structure outwardly protrudes from the first and second portions of the second spacer structure.

10. The integrated circuit of claim 9, wherein the first semiconductor nanoribbon is one of a first plurality of semiconductor nanoribbons that extend between the first source region and the first drain region, and the second semiconductor nanoribbon is one of a second plurality of semiconductor nanoribbons that extend between the second source region and the second drain region.

11. The integrated circuit of claim 9, wherein the first semiconductor nanoribbon is an uppermost semiconductor nanoribbon of the first plurality of semiconductor nanoribbons, and the second semiconductor nanoribbon is a lowermost semiconductor nanoribbon of the second plurality of semiconductor nanoribbons, and a distance between the first semiconductor nanoribbon and the second semiconductor nanoribbon along the second direction is between 30 nm and 80 nm.

12. The integrated circuit of claim 9, further comprising:

a first layer including nitrogen and a metal, the first layer between the third portion of the first spacer structure and a gate structure and/or an isolation structure along the first direction; and a second layer including nitrogen and the metal, the second layer between the third portion of the second spacer structure and the gate structure and/or the isolation structure along the first direction.

13. An electronic device, comprising:

a chip package comprising one or more dies, at least one of the one or more dies comprising a semiconductor device having a first plurality of semiconductor nanoribbons extending in a first direction between a first source region and a first drain region and a second plurality of semiconductor nanoribbons extending in the first direction between a second source region and a second drain region, the first plurality of semiconductor nanoribbons spaced from the second plurality of semiconductor nanoribbons in a second direction orthogonal to the first direction;

a gate structure around both the first plurality of semiconductor nanoribbons and the second plurality of semiconductor nanoribbons;

a first outwardly protruding spacer structure having a first portion extending in the second direction along a side of the first source region, a second portion extending in the second direction along a side of the second source region, and a third portion connecting, and laterally outward from, the first and second portions of the first spacer structure, each of the first, second, and third portions of the first spacer structure being a same continuous material; and a second outwardly protruding spacer structure having a first portion extending in the second direction along a side of the first drain region, a second portion extending in the second direction along a side of the second drain region, and a third portion connecting, and laterally outward from, the first and second portions of the second spacer structure, each of the first, second, and third portions of the second spacer structure being a same continuous material;

wherein a maximum distance along the first direction between the third portion of the first spacer structure and the third portion of the second spacer structure is more than 5 nm longer than a maximum distance along the first direction between the first portion of the first spacer structure and the first portion of the second spacer structure.

14. The electronic device of claim 13, wherein the first plurality of semiconductor nanoribbons and the second plurality of semiconductor nanoribbons comprise germanium, silicon, or any combination thereof.

15. The electronic device of claim 13, wherein the first source region and the first drain region comprise n-type dopants and the second source region and the second drain region comprise p-type dopants.

16. The electronic device of claim 13, wherein a distance along the second direction between the first plurality of semiconductor nanoribbons and the second plurality of semiconductor nanoribbons is between 30 nm and 80 nm.

17. The electronic device of claim 13, wherein the at least one of the one or more dies further comprises a metal nitride layer along a sidewall portion of the gate structure between the first plurality of semiconductor nanoribbons and the second plurality of semiconductor nanoribbons.

18. The electronic device of claim 17, wherein the metal nitride layer comprises titanium and nitrogen.

19. The electronic device of claim 13, wherein the maximum distance along the first direction between the third portion of the first spacer structure and the third portion of the second spacer structure is between 5 nm and 10 nm greater than the maximum distance along the first direction between the first portion of the first spacer structure and the first portion of the second spacer structure.

20. The electronic device of claim 13, further comprising a printed circuit board, wherein the chip package is attached to the printed circuit board.

21. The integrated circuit of claim 1, wherein each of the first portion, second portion, and third portion of the first spacer structure has a same width along the first direction, and each of the first portion, second portion, and third portion of the second spacer structure has a same width along the first direction.

22. The integrated circuit of claim 1, wherein a dimension of the third portion of the first spacer structure along the second direction and a dimension of the third portion of the second spacer structure along the second direction are greater than a thickness of the first semiconductor body or the second semiconductor body along the second direction.

* * * * *